US010374013B2

(12) United States Patent
Bandyopadhyay et al.

(10) Patent No.: US 10,374,013 B2
(45) Date of Patent: Aug. 6, 2019

(54) METHODS AND APPARATUS FOR THREE-DIMENSIONAL NONVOLATILE MEMORY

(71) Applicant: SANDISK TECHNOLOGIES LLC, Plano, TX (US)

(72) Inventors: Abhijit Bandyopadhyay, San Jose, CA (US); Christopher J. Petti, Mountain View, CA (US); Natalie Nguyen, Milpitas, CA (US); Brian Le, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 41 days.

(21) Appl. No.: 15/473,671

(22) Filed: Mar. 30, 2017

(65) Prior Publication Data

US 2018/0286918 A1 Oct. 4, 2018

(51) Int. Cl.

| | |
|---|---|
| ***H01L 27/24*** | (2006.01) |
| ***H01L 27/11*** | (2006.01) |
| ***H01L 27/11582*** | (2017.01) |
| ***H01L 27/11556*** | (2017.01) |
| ***H01L 21/768*** | (2006.01) |
| ***H01L 45/00*** | (2006.01) |
| ***H01L 27/22*** | (2006.01) |
| ***H01L 43/08*** | (2006.01) |
| ***H01L 43/12*** | (2006.01) |

(52) U.S. Cl.

CPC ...... *H01L 27/249* (2013.01); *H01L 21/76895* (2013.01); *H01L 27/11556* (2013.01); *H01L 27/11582* (2013.01); *H01L 27/228* (2013.01); *H01L 27/2409* (2013.01); *H01L 27/2436* (2013.01); *H01L 43/08* (2013.01); *H01L 43/12* (2013.01); *H01L 45/06* (2013.01); *H01L 45/085* (2013.01); *H01L 45/1226* (2013.01); *H01L 45/146* (2013.01); *H01L 45/148* (2013.01); *H01L 45/16* (2013.01)

(58) Field of Classification Search

CPC ........ H01L 27/249; H01L 21/76; H01L 43/08
USPC .......................................................... 438/2–4
See application file for complete search history.

(56) References Cited

U.S. PATENT DOCUMENTS 5,192,704 A * 3/1993 McDavid ................ G11C 11/22
257/E27.104
6,482,658 B2 * 11/2002 Kang ...................... G11C 11/22
257/E21.664

(Continued)

FOREIGN PATENT DOCUMENTS

WO 2016122442 A1 8/2016

OTHER PUBLICATIONS

International Search Report & Written Opinion dated Mar. 8, 2018 in International Patent Application No. PCT/US2017/063680.

*Primary Examiner* — Sheikh Maruf
(74) *Attorney, Agent, or Firm* — Vierra Magen Marcus LLP

(57) ABSTRACT

A method is provided that includes forming a bit line above a substrate; forming a word line above the substrate, and forming a non-volatile memory cell between the bit line and the word line. The non-volatile memory cell includes a non-volatile memory material coupled in series with an isolation element. The isolation element includes a first electrode, a second electrode, and a semiconductor layer and a barrier layer disposed between the first electrode and the second electrode.

18 Claims, 33 Drawing Sheets

(56) References Cited

U.S. PATENT DOCUMENTS

| | | | | |
|---|---|---|---|---|
| 8,298,875 | B1 * | 10/2012 | Or-Bach | H01L 29/4236 257/E21.411 |
| 2001/0006473 | A1 * | 7/2001 | Kang | G11C 11/22 365/145 |
| 2001/0010938 | A1 * | 8/2001 | Bronner | B82Y 10/00 438/3 |
| 2003/0013210 | A1 * | 1/2003 | Ramesh | H01L 21/76877 438/3 |
| 2003/0199104 | A1 * | 10/2003 | Leuschner | B82Y 25/00 438/3 |
| 2008/0007991 | A1 * | 1/2008 | Diteweg | G11C 11/16 365/158 |
| 2008/0310213 | A1 * | 12/2008 | Chen | B82Y 10/00 365/158 |
| 2009/0185410 | A1 * | 7/2009 | Huai | G11C 11/16 365/158 |
| 2010/0096611 | A1 * | 4/2010 | Wang | H01L 27/228 257/4 |
| 2010/0259962 | A1 * | 10/2010 | Yan | B82Y 10/00 365/51 |
| 2011/0065270 | A1 * | 3/2011 | Shim | H01L 27/11556 438/589 |
| 2011/0210306 | A1 * | 9/2011 | Li | H01L 45/04 257/3 |
| 2011/0261607 | A1 * | 10/2011 | Tang | G11C 13/0007 365/148 |
| 2012/0112156 | A1 * | 5/2012 | Park | H01L 27/101 257/5 |
| 2012/0147644 | A1 * | 6/2012 | Scheuerlein | G11C 13/0002 365/51 |
| 2012/0147650 | A1 * | 6/2012 | Samachisa | G11C 13/0002 365/51 |
| 2013/0153851 | A1 * | 6/2013 | Park | H01L 43/08 257/4 |
| 2013/0187114 | A1 * | 7/2013 | Kai | B82Y 10/00 257/3 |
| 2013/0229846 | A1 * | 9/2013 | Chien | H01L 27/2454 365/51 |
| 2013/0336037 | A1 * | 12/2013 | Chen | H01L 27/249 365/51 |
| 2013/0337646 | A1 * | 12/2013 | Cernea | H01L 27/2454 438/666 |
| 2014/0246643 | A1 * | 9/2014 | Kim | H01L 27/2481 257/4 |
| 2014/0254231 | A1 * | 9/2014 | Cernea | G11C 5/06 365/63 |
| 2014/0361239 | A1 * | 12/2014 | Ramaswamy | H01L 27/249 257/5 |
| 2015/0069541 | A1 * | 3/2015 | Chen | H01L 43/12 257/421 |
| 2015/0076668 | A1 * | 3/2015 | Shih | H01L 21/76883 257/623 |
| 2015/0179659 | A1 * | 6/2015 | Takaki | H01L 21/76895 257/5 |
| 2015/0249053 | A1 * | 9/2015 | Or-Bach | H01L 23/5386 257/401 |
| 2015/0255515 | A1 * | 9/2015 | Nakai | H01L 27/2481 365/148 |
| 2015/0340316 | A1 * | 11/2015 | Or-Bach | G11C 5/025 257/2 |
| 2015/0340406 | A1 * | 11/2015 | Jo | H01L 45/141 29/604 |
| 2016/0155779 | A1 * | 6/2016 | Park | G11C 5/02 257/4 |
| 2016/0181259 | A1 * | 6/2016 | Van Houdt | H01L 27/1159 365/145 |
| 2017/0154845 | A1 * | 6/2017 | Takaki | H01L 23/528 |
| 2018/0006088 | A1 * | 1/2018 | Sheng | H01L 27/2463 |

* cited by examiner

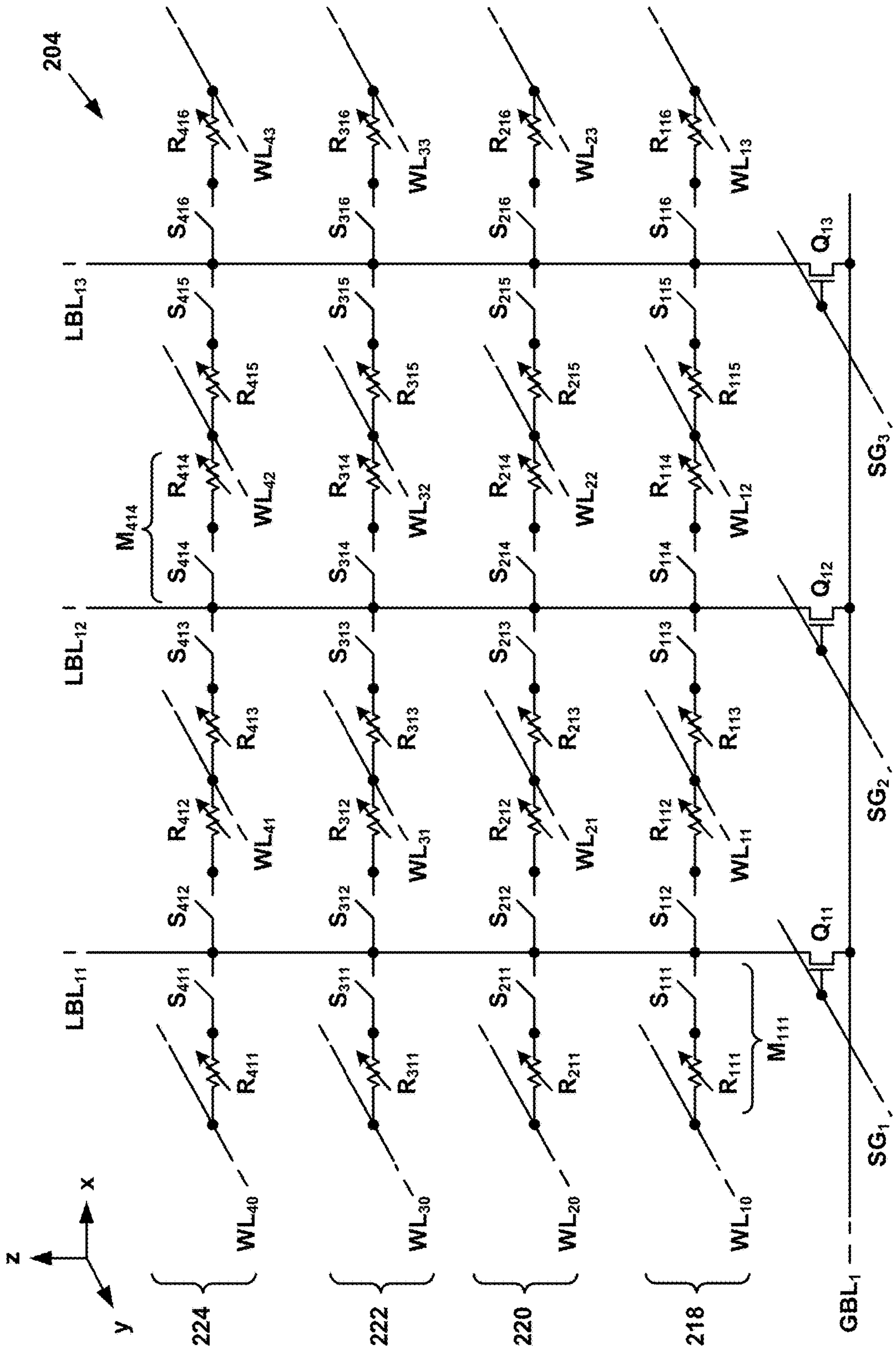
FIG. 2C1

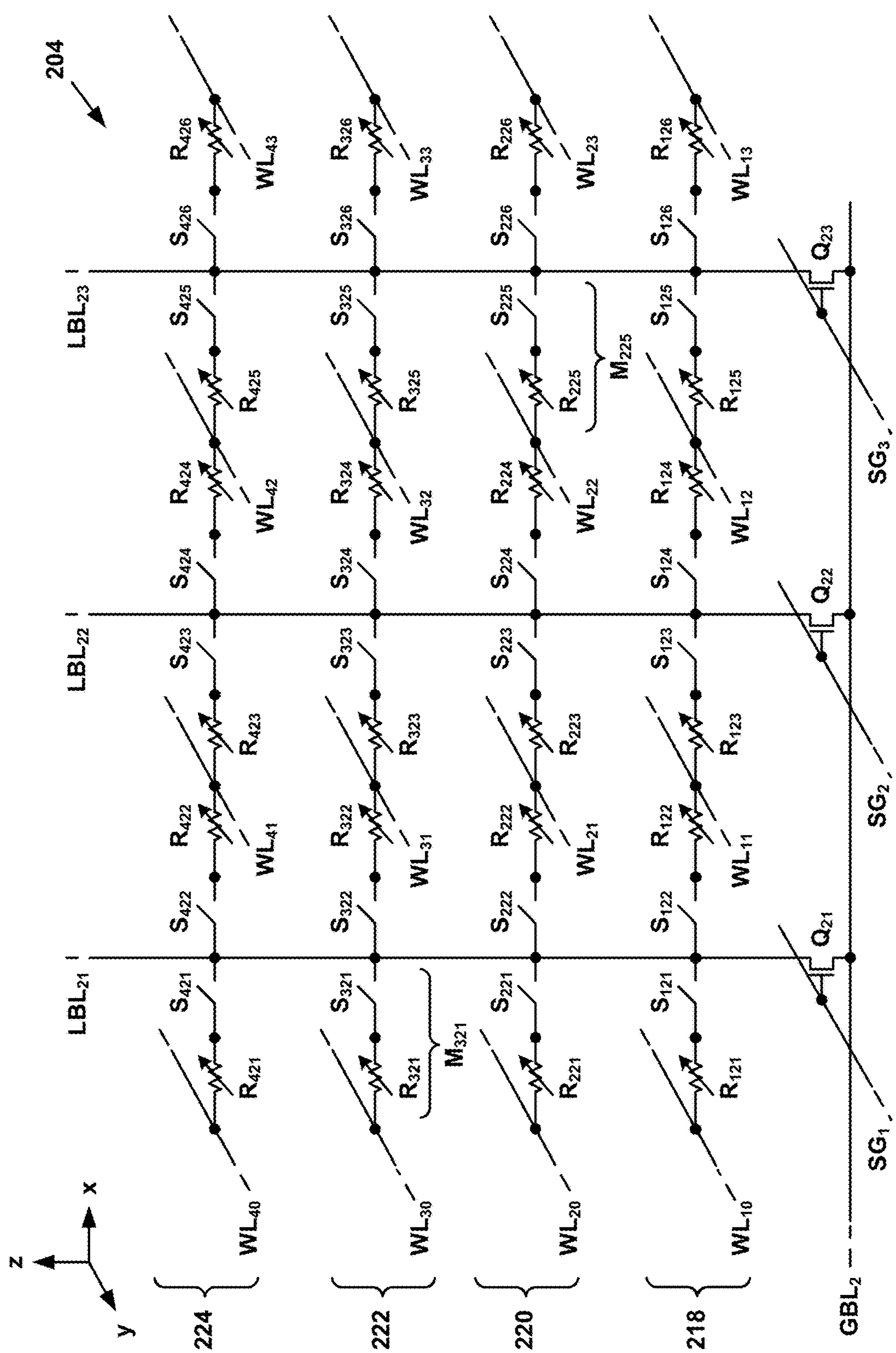
FIG. 2C2

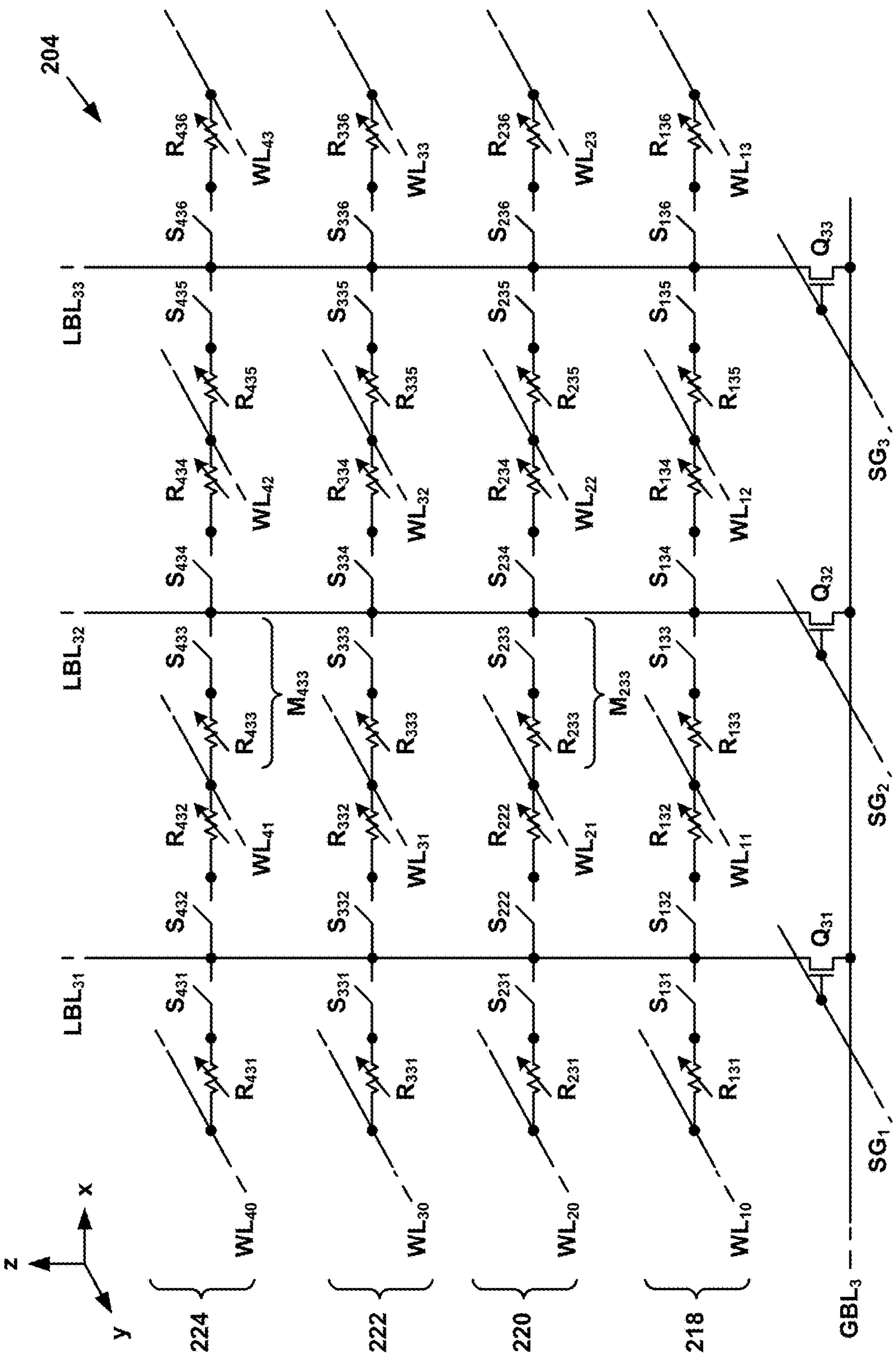
FIG. 2C3

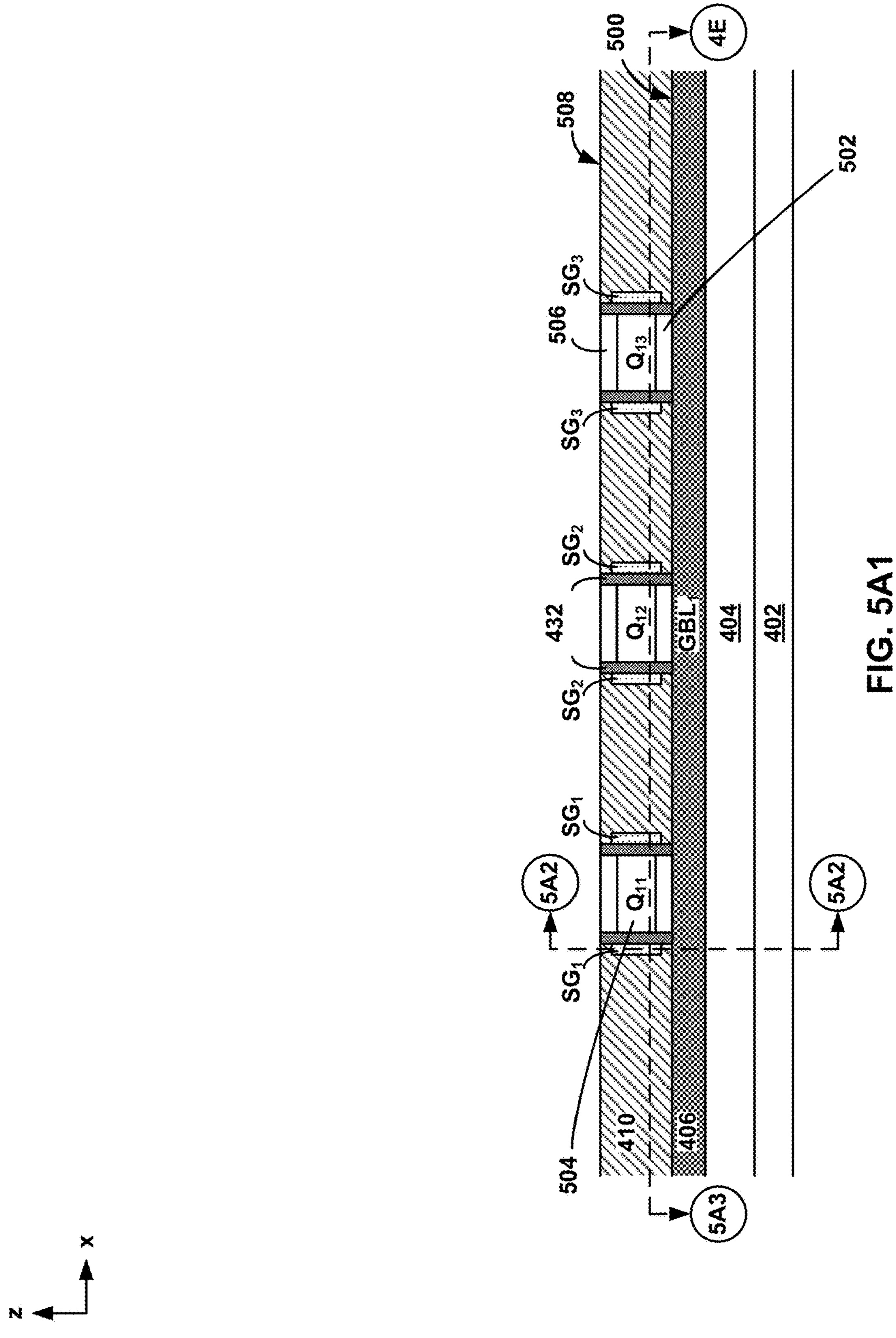
FIG. 5A1

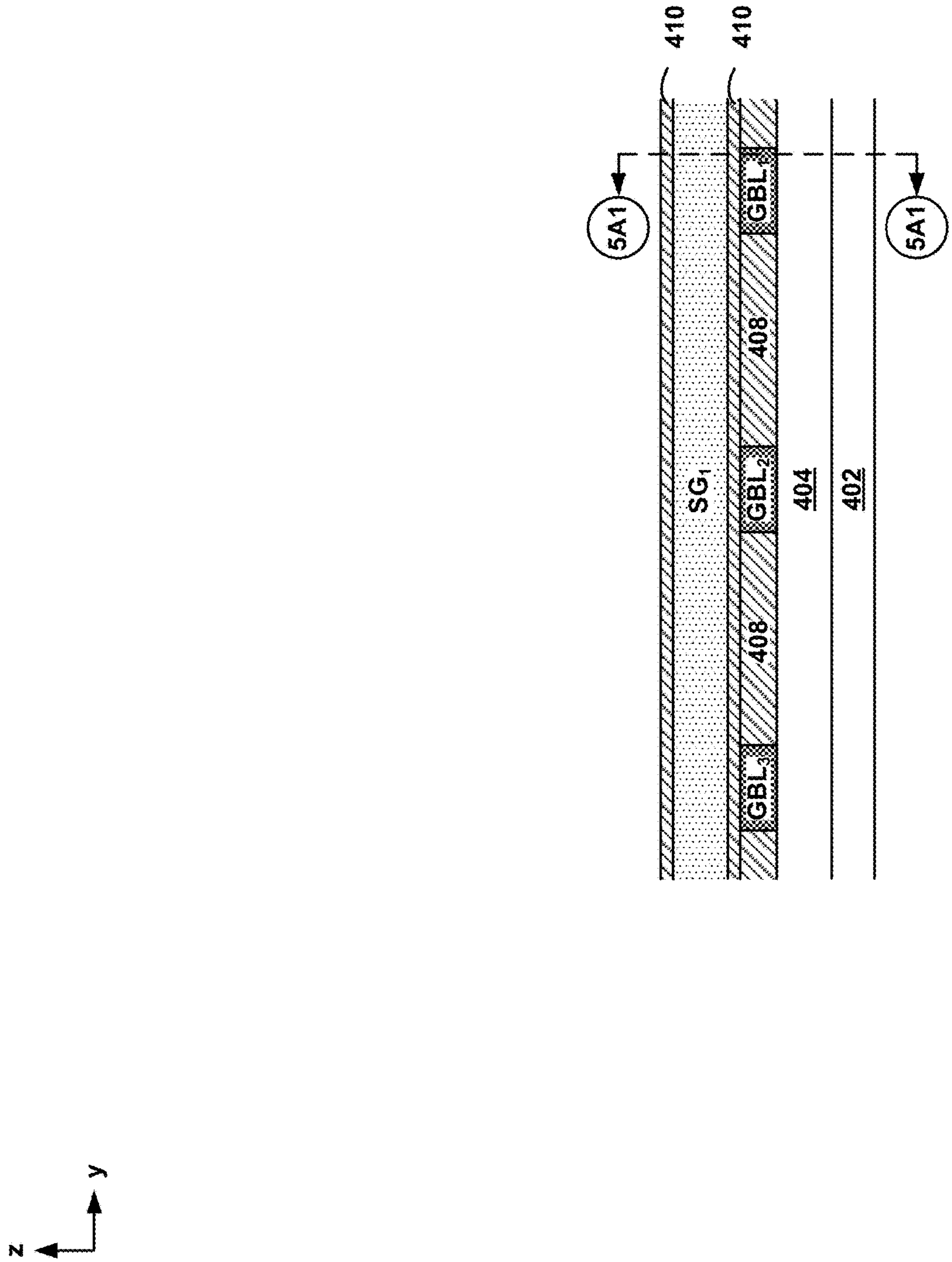
FIG. 5A2

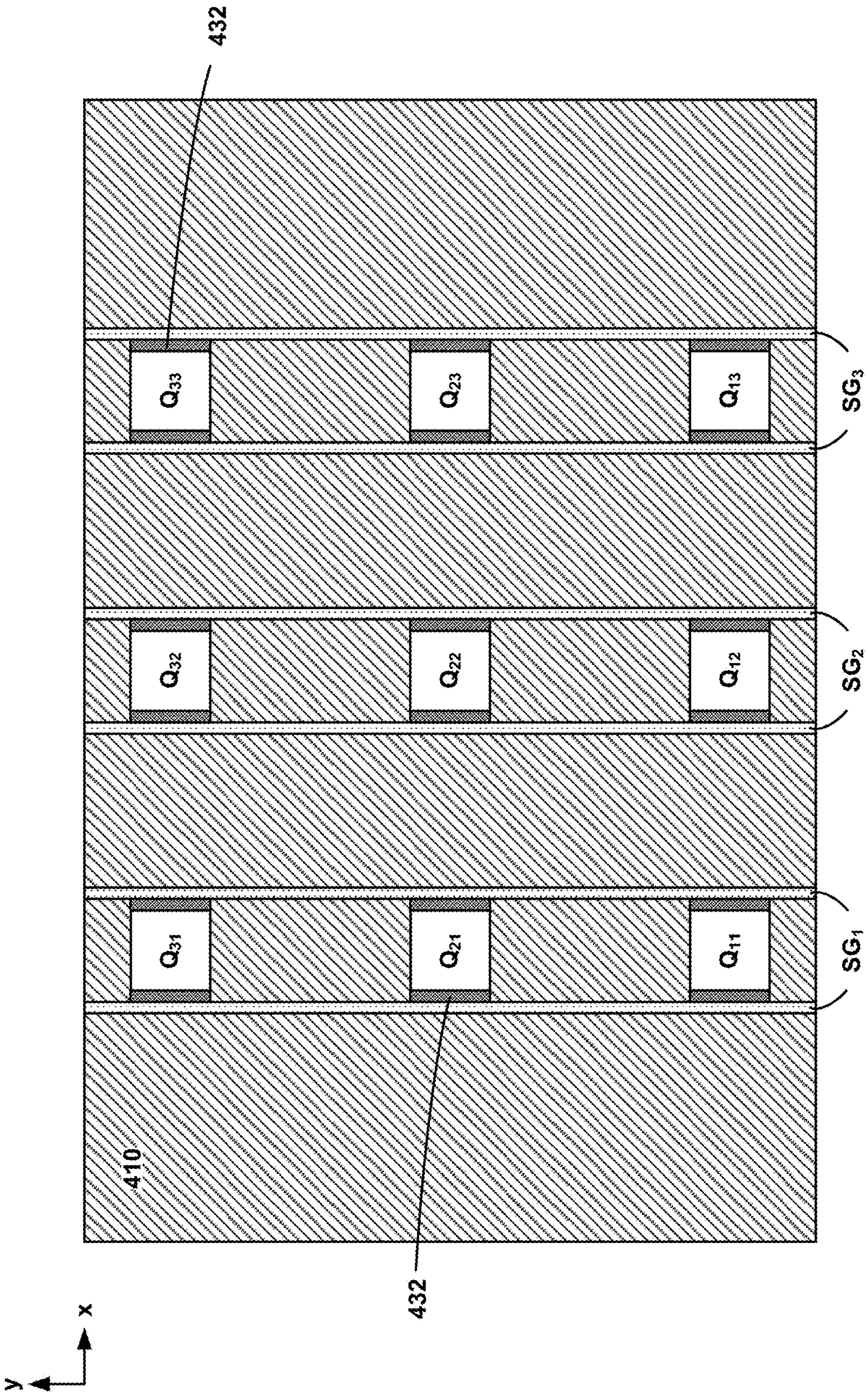
FIG. 5A3

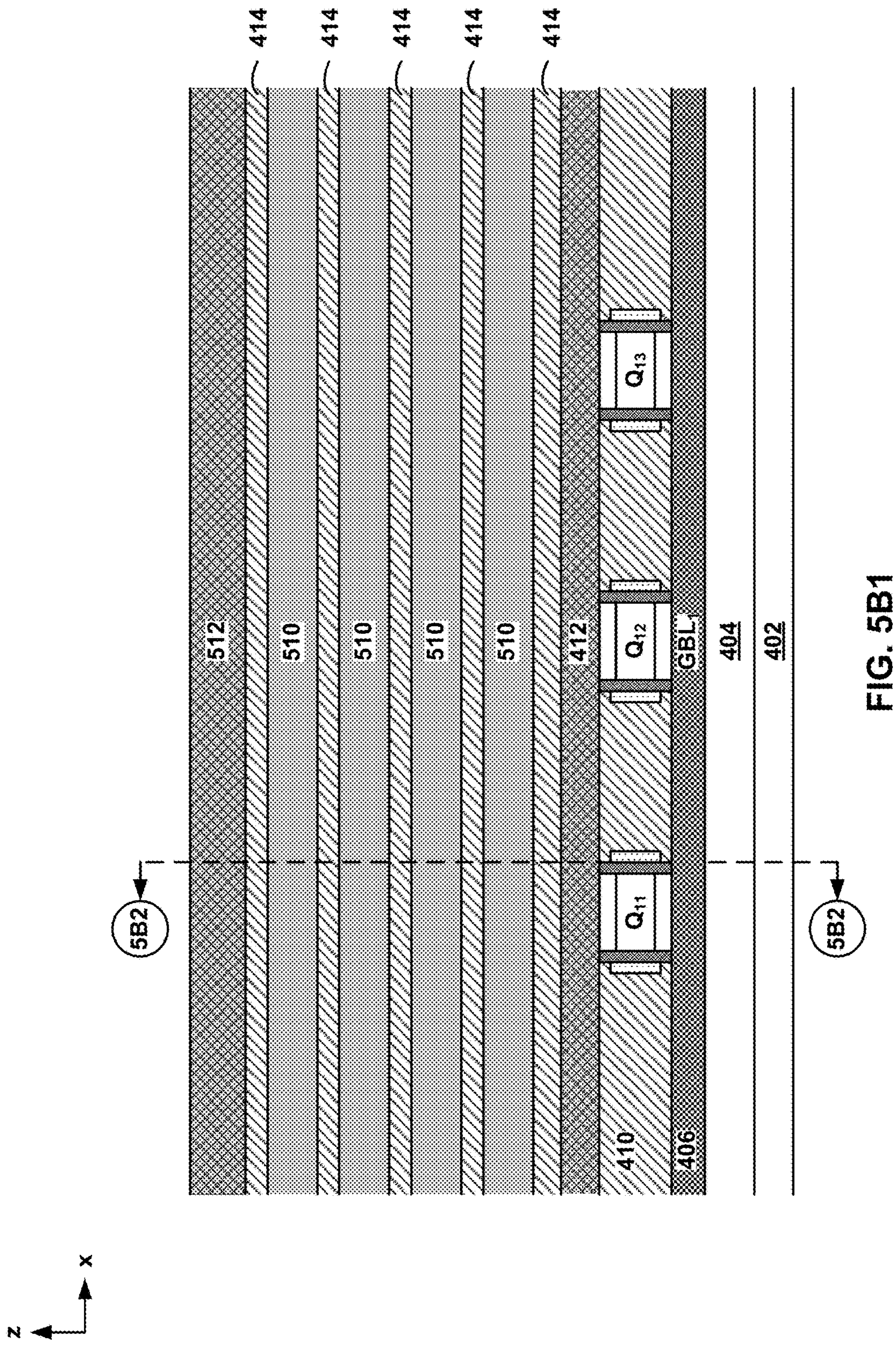
FIG. 5B1

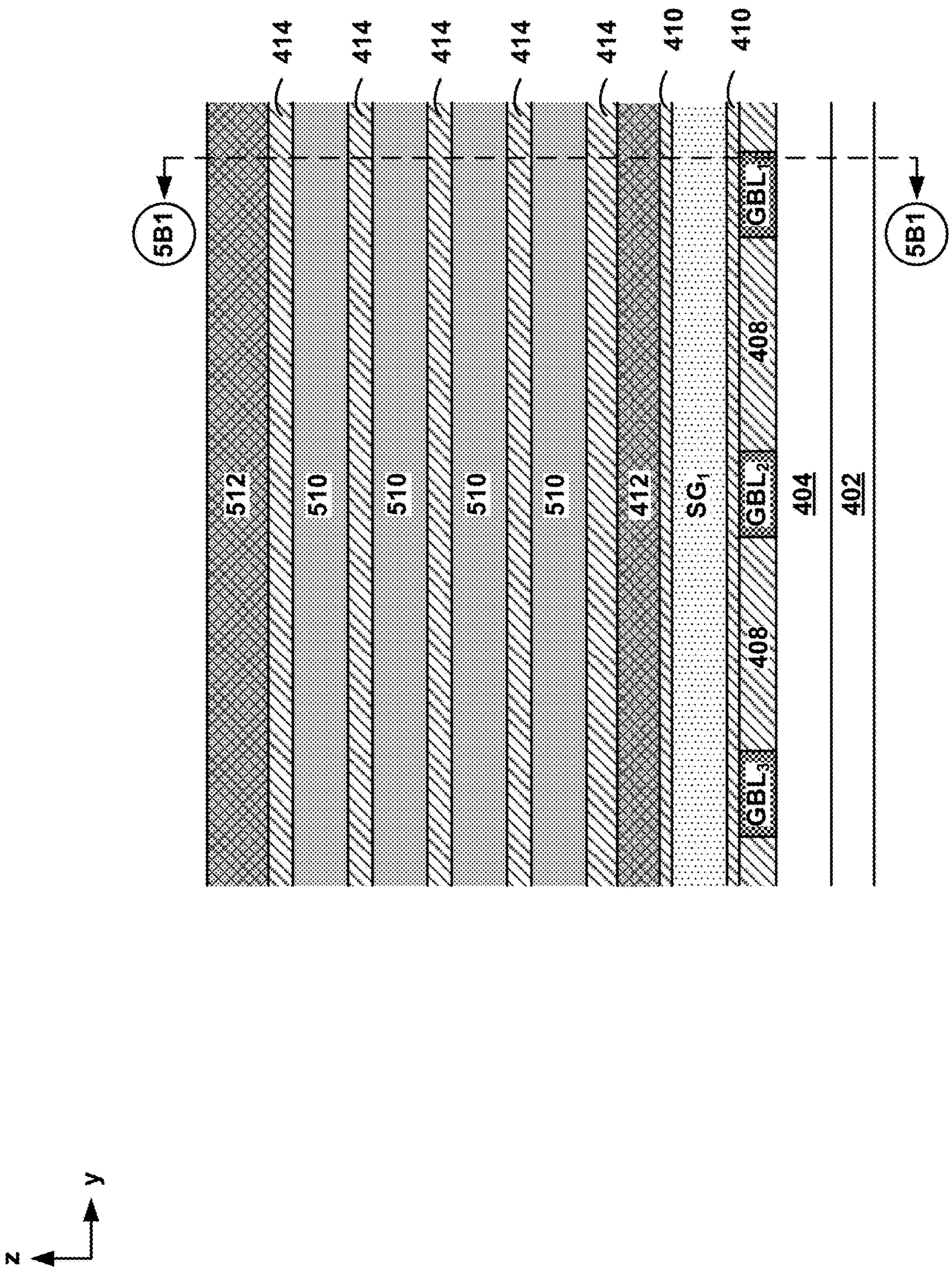
FIG. 5B2

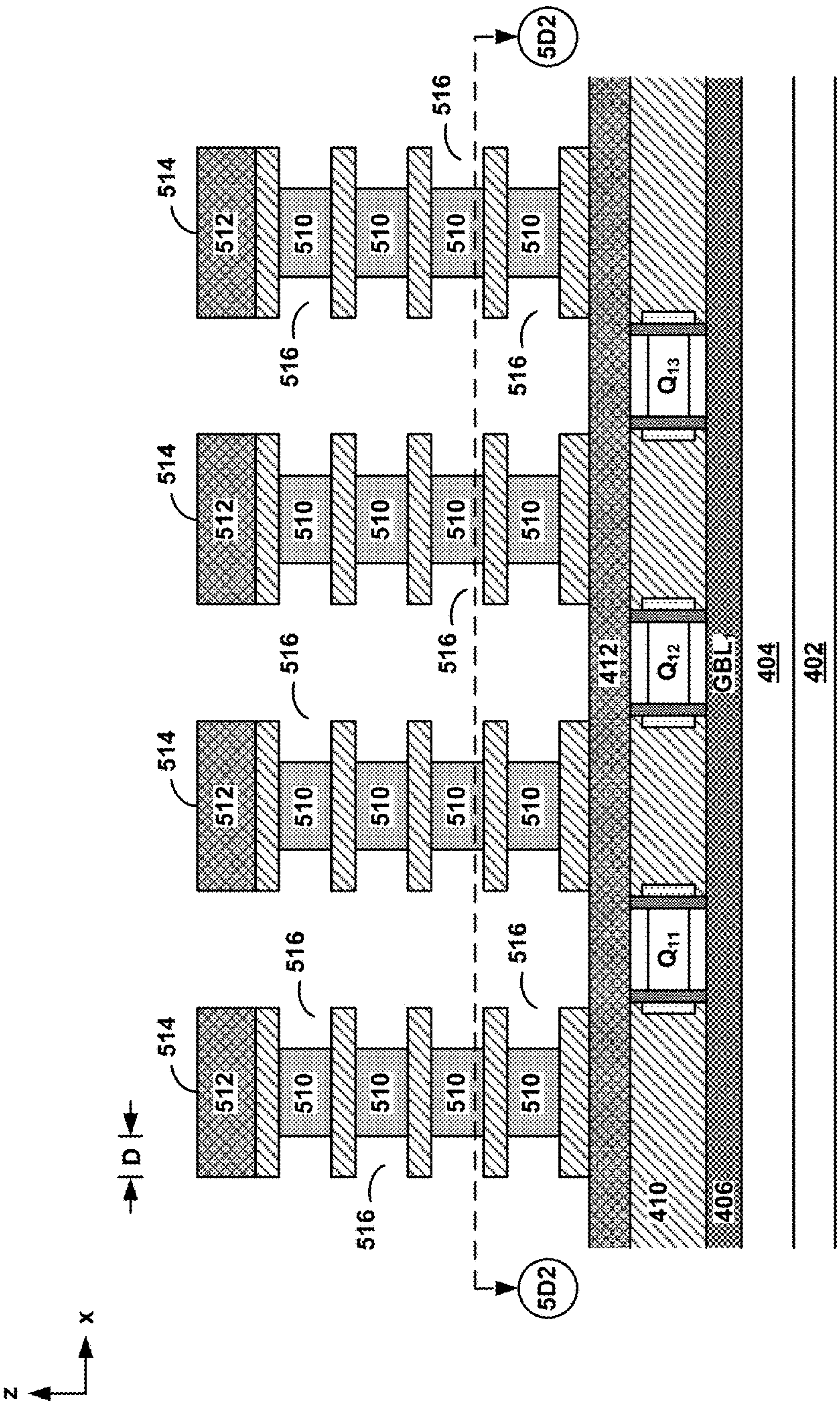
FIG. 5D1

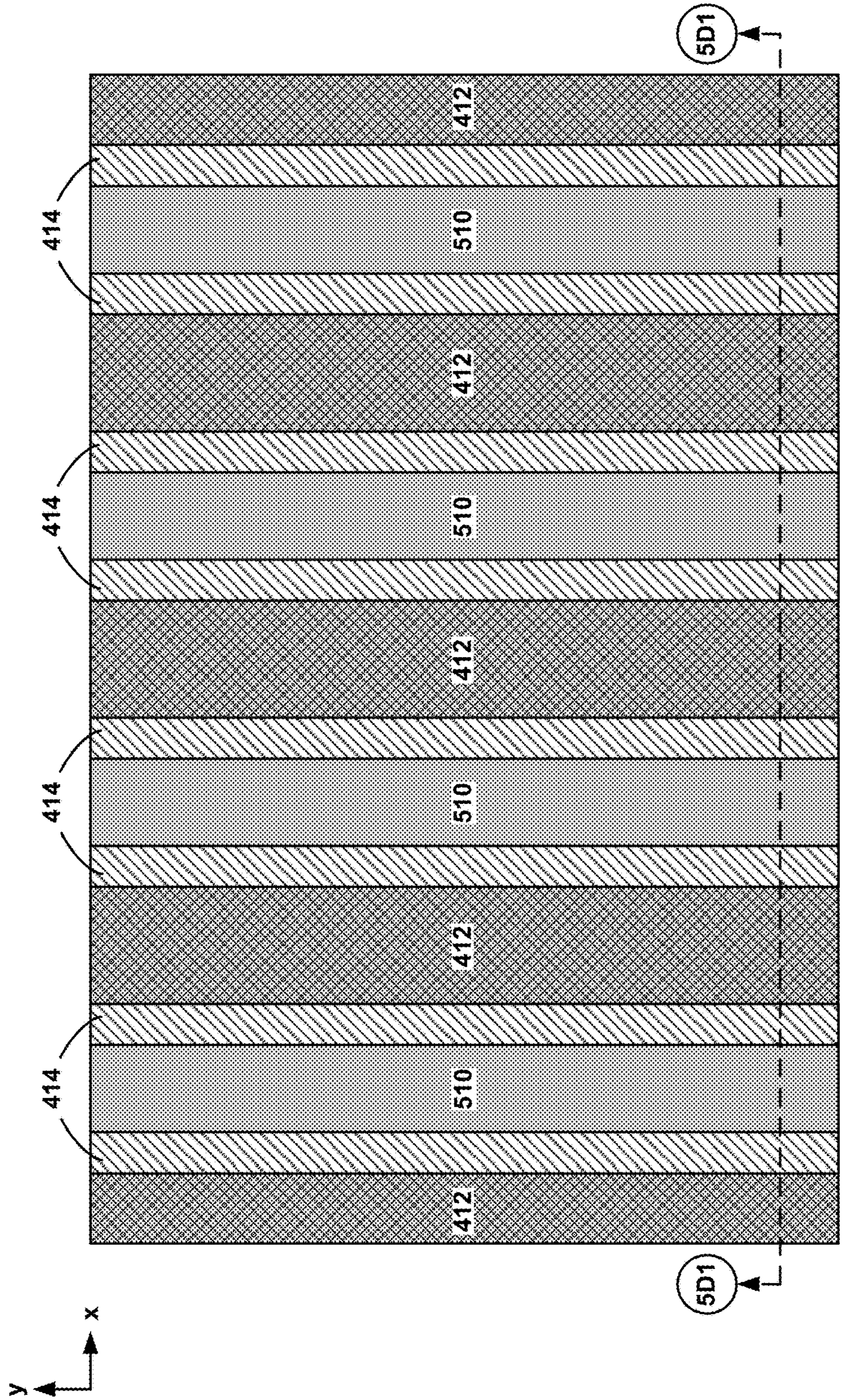
FIG. 5D2

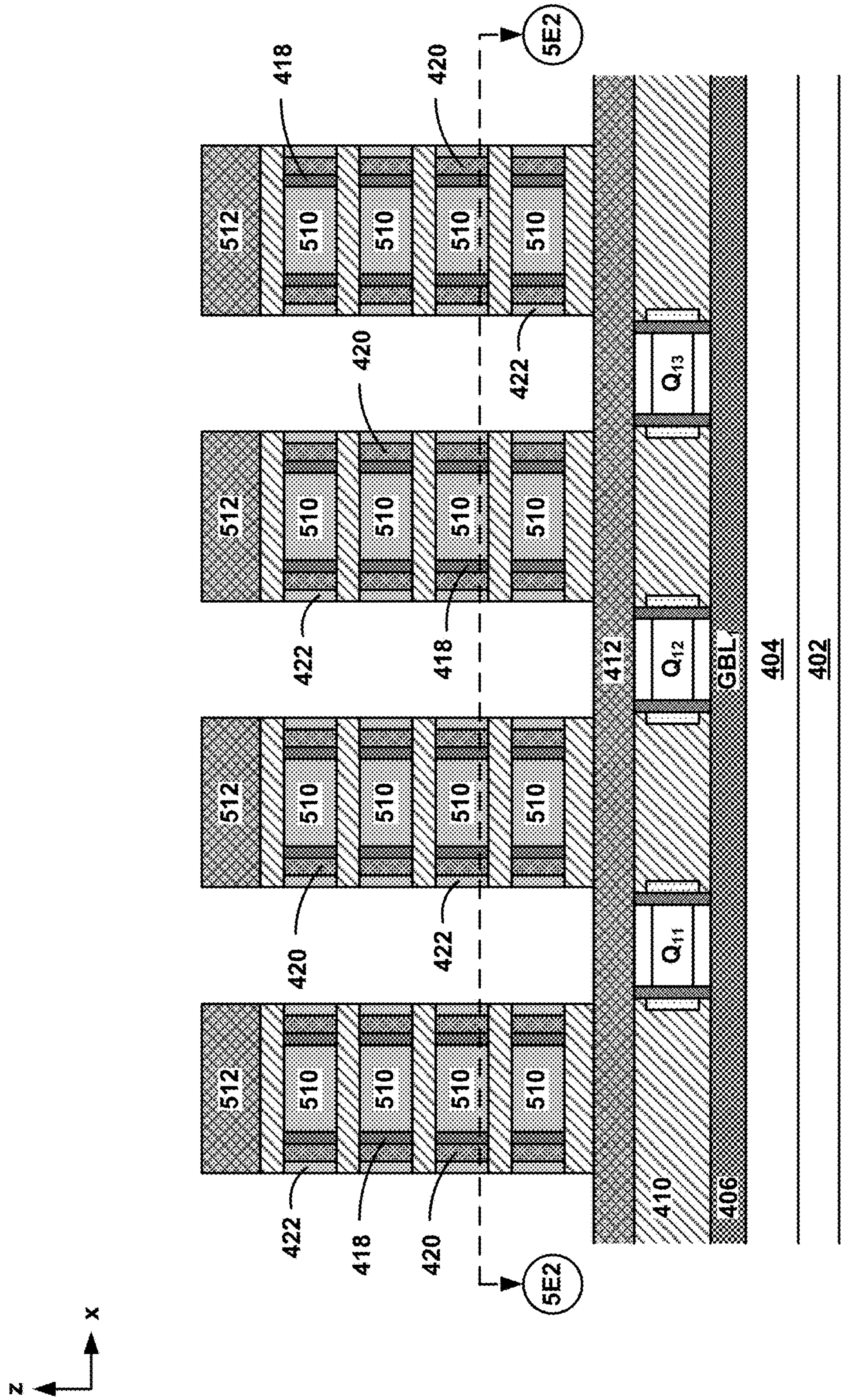
FIG. 5E1

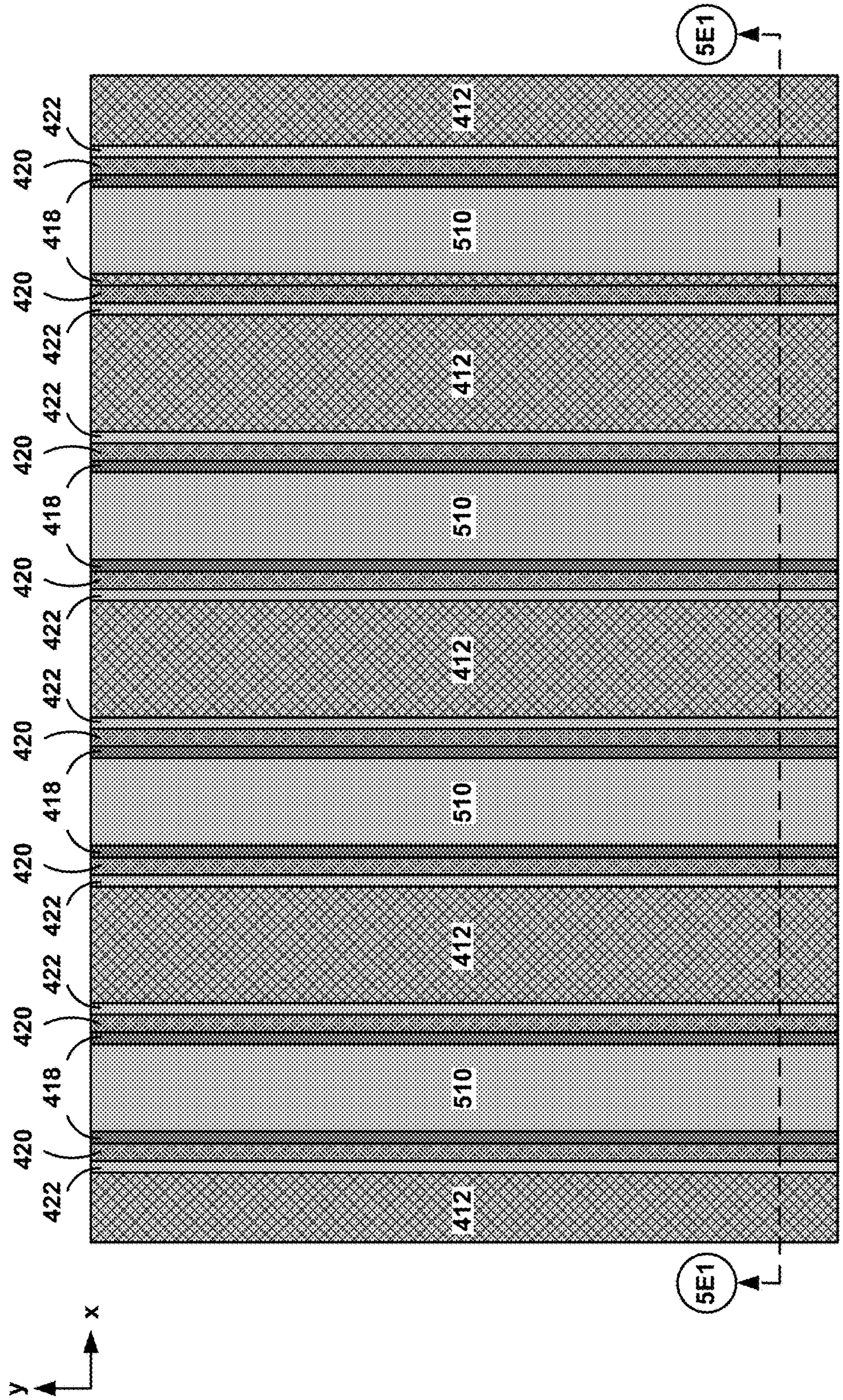
FIG. 5E2

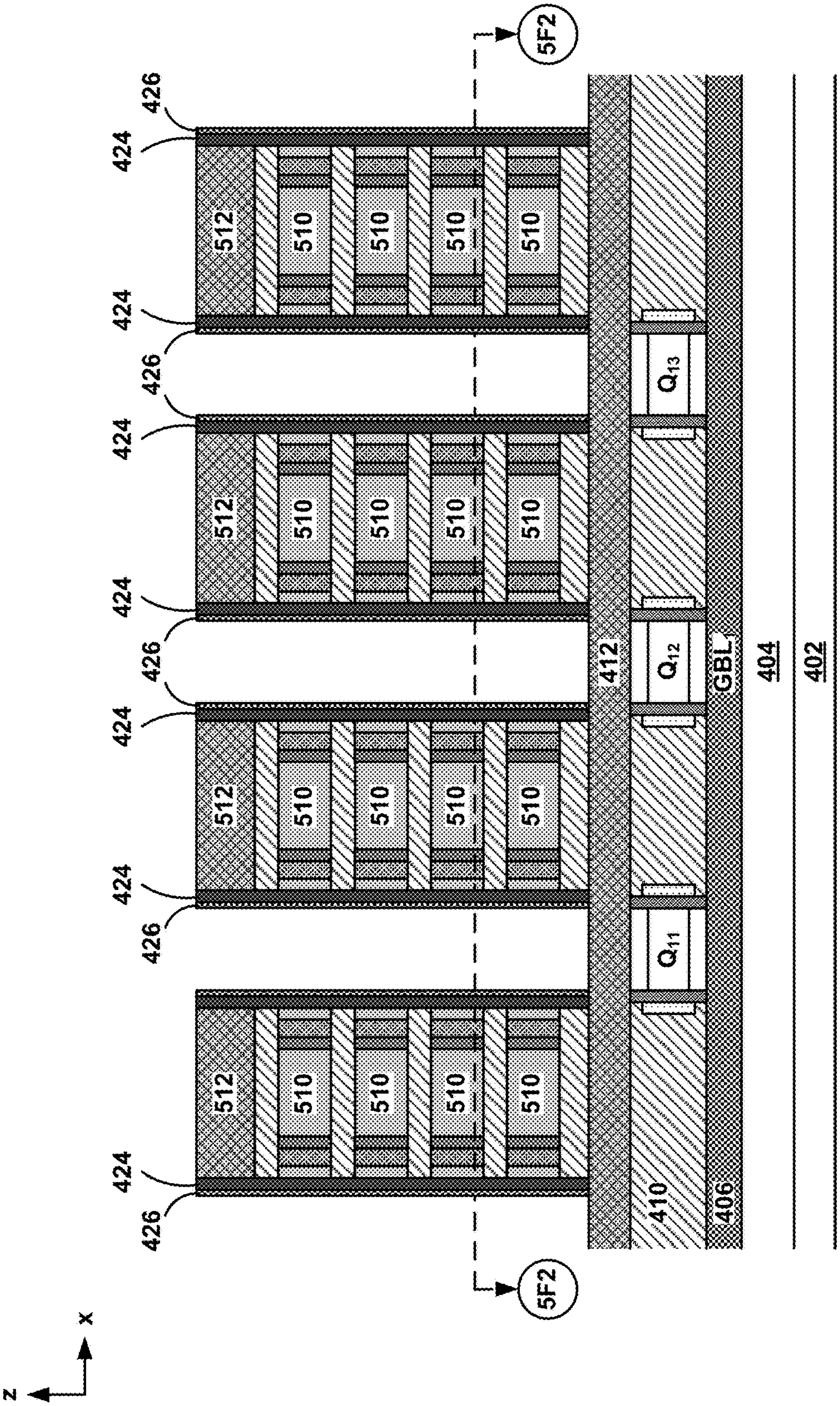
FIG. 5F1

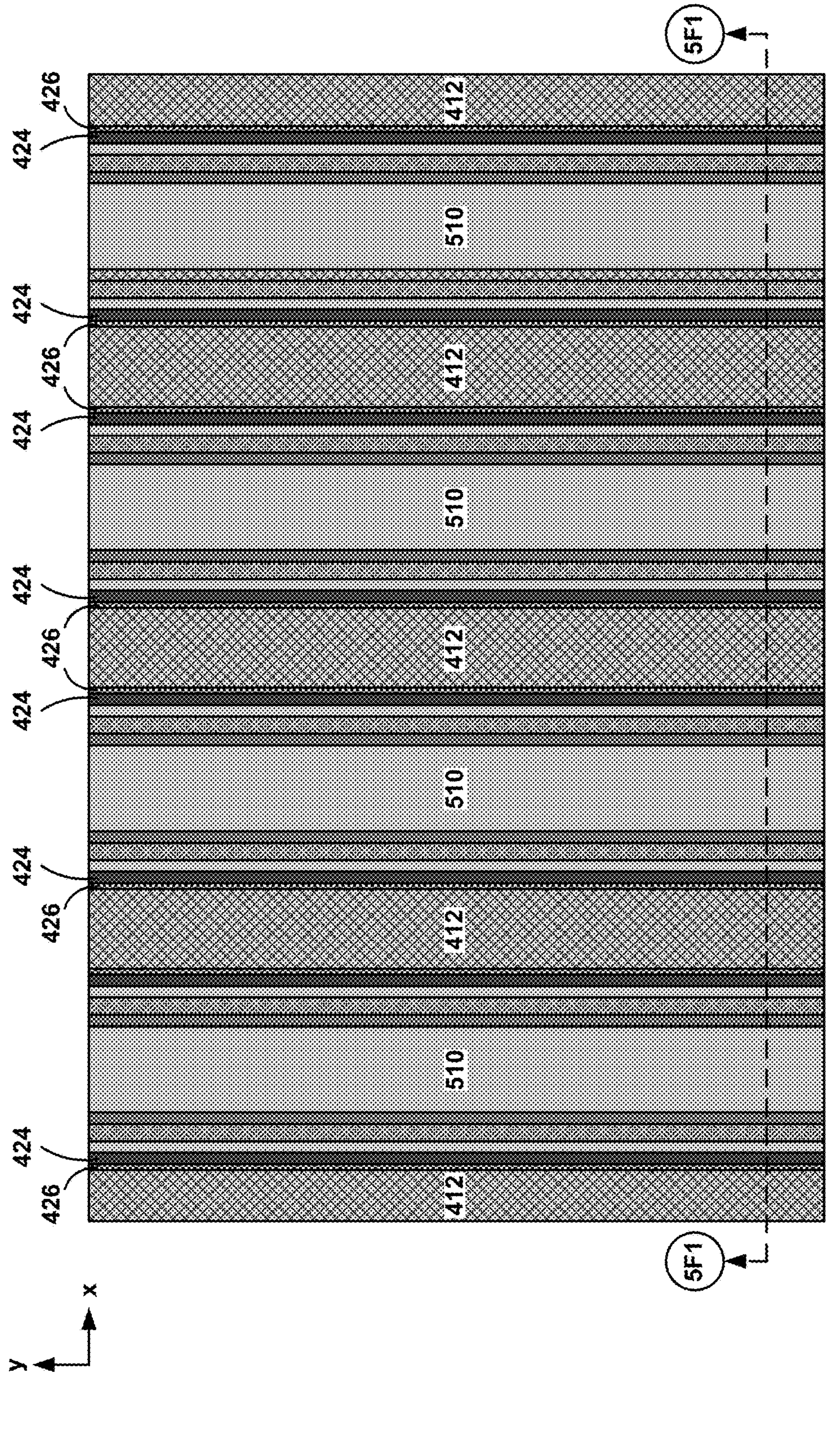
FIG. 5F2

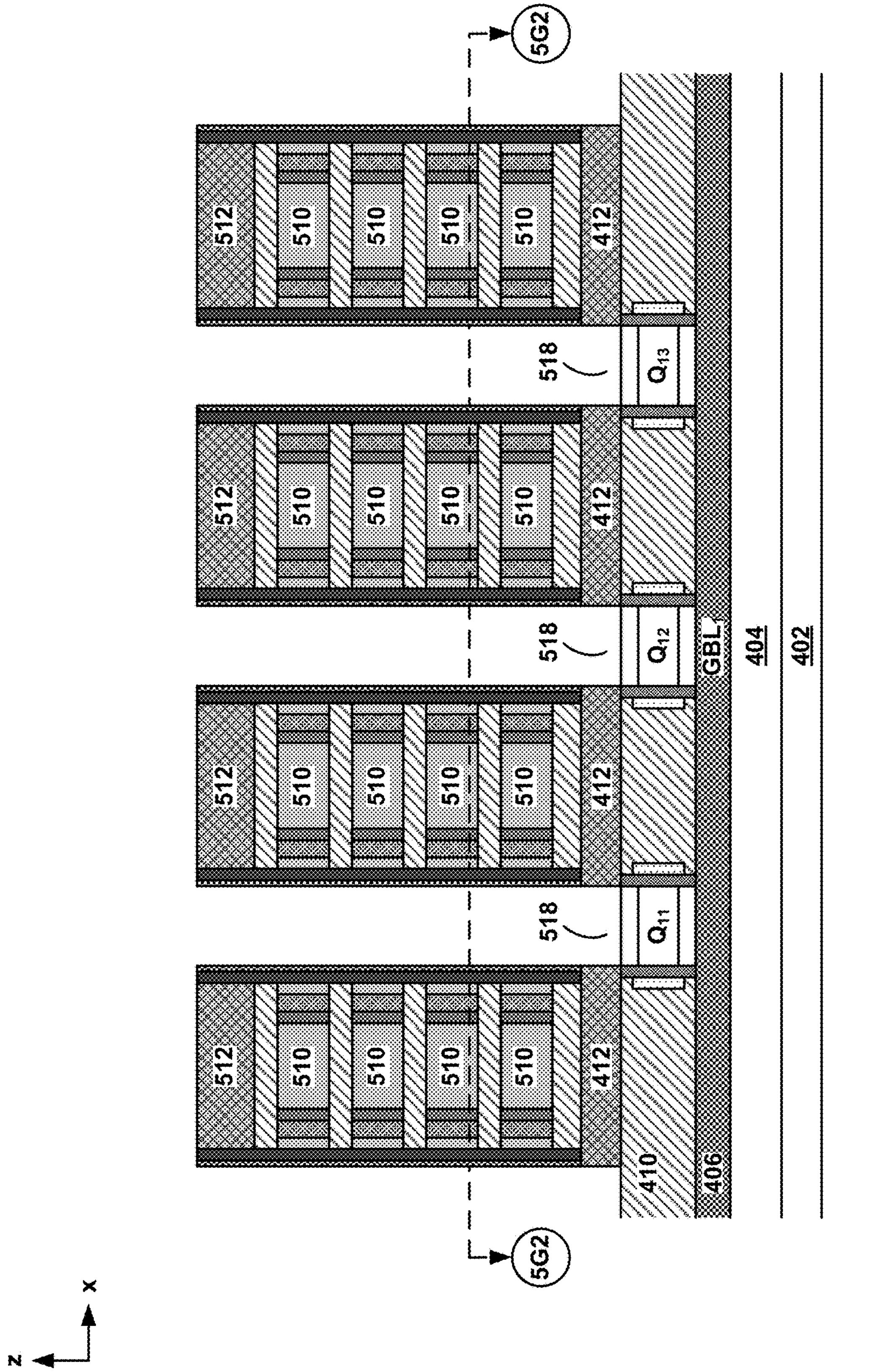
FIG. 5G1

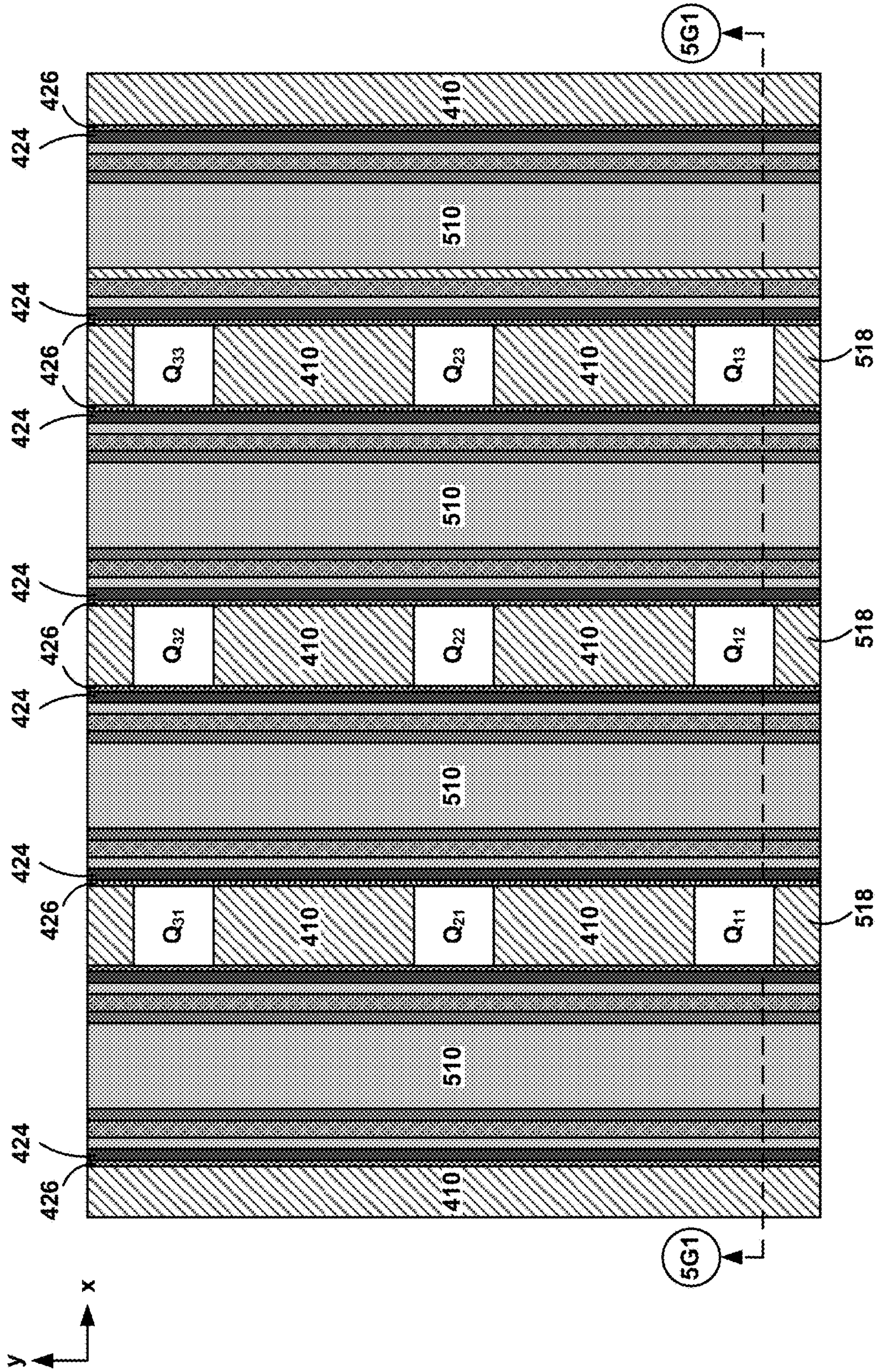
FIG. 5G2

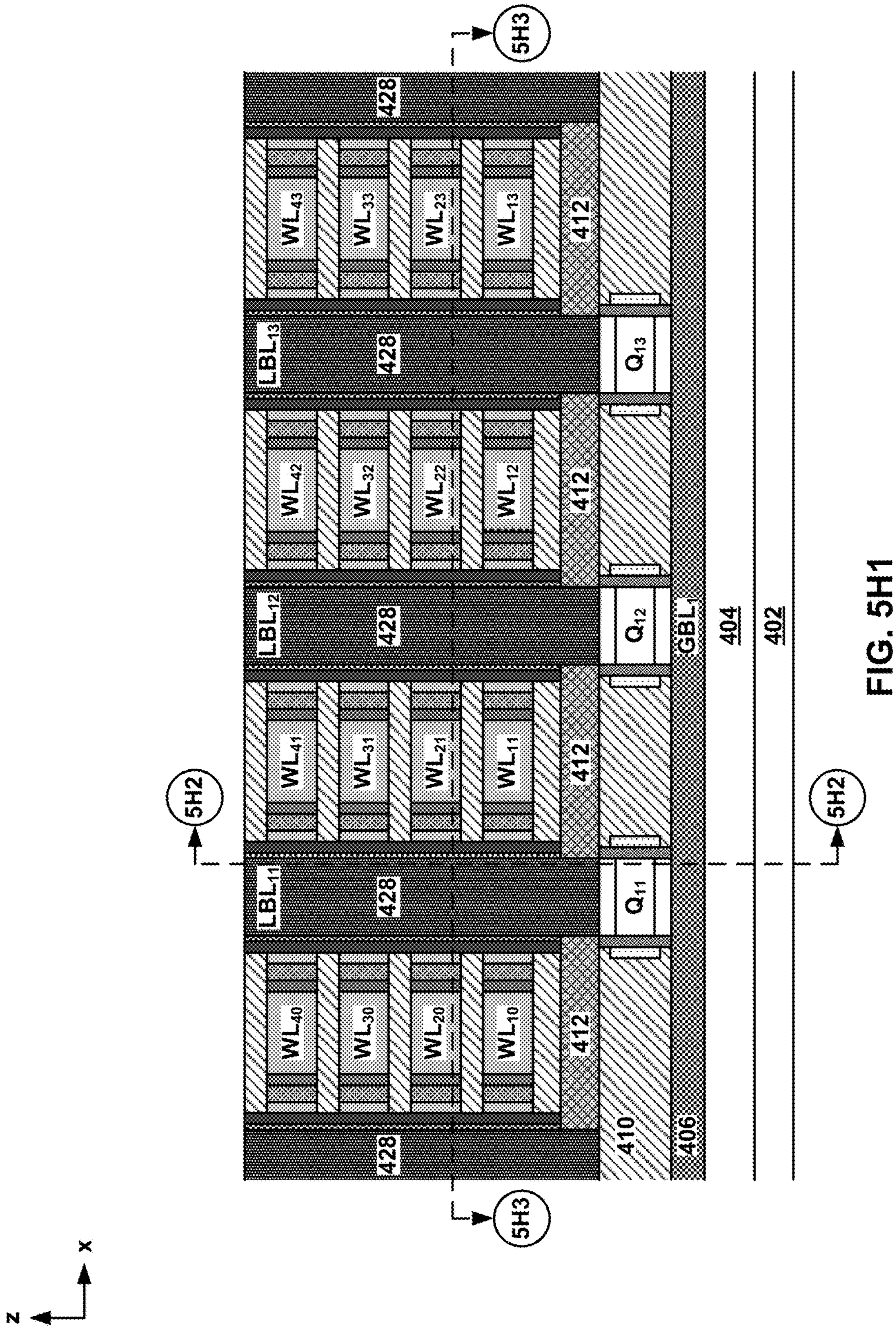
FIG. 5H1

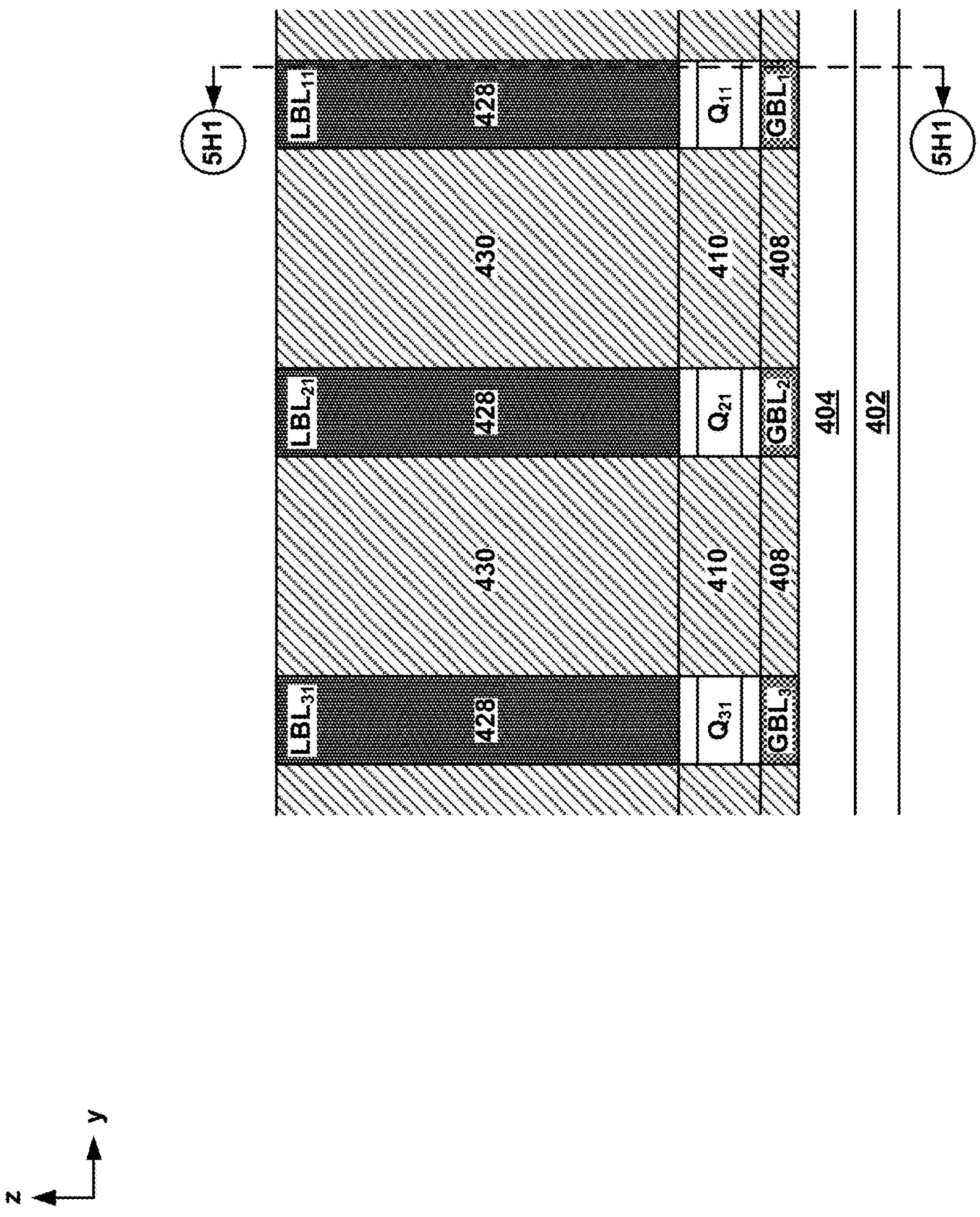
FIG. 5H2

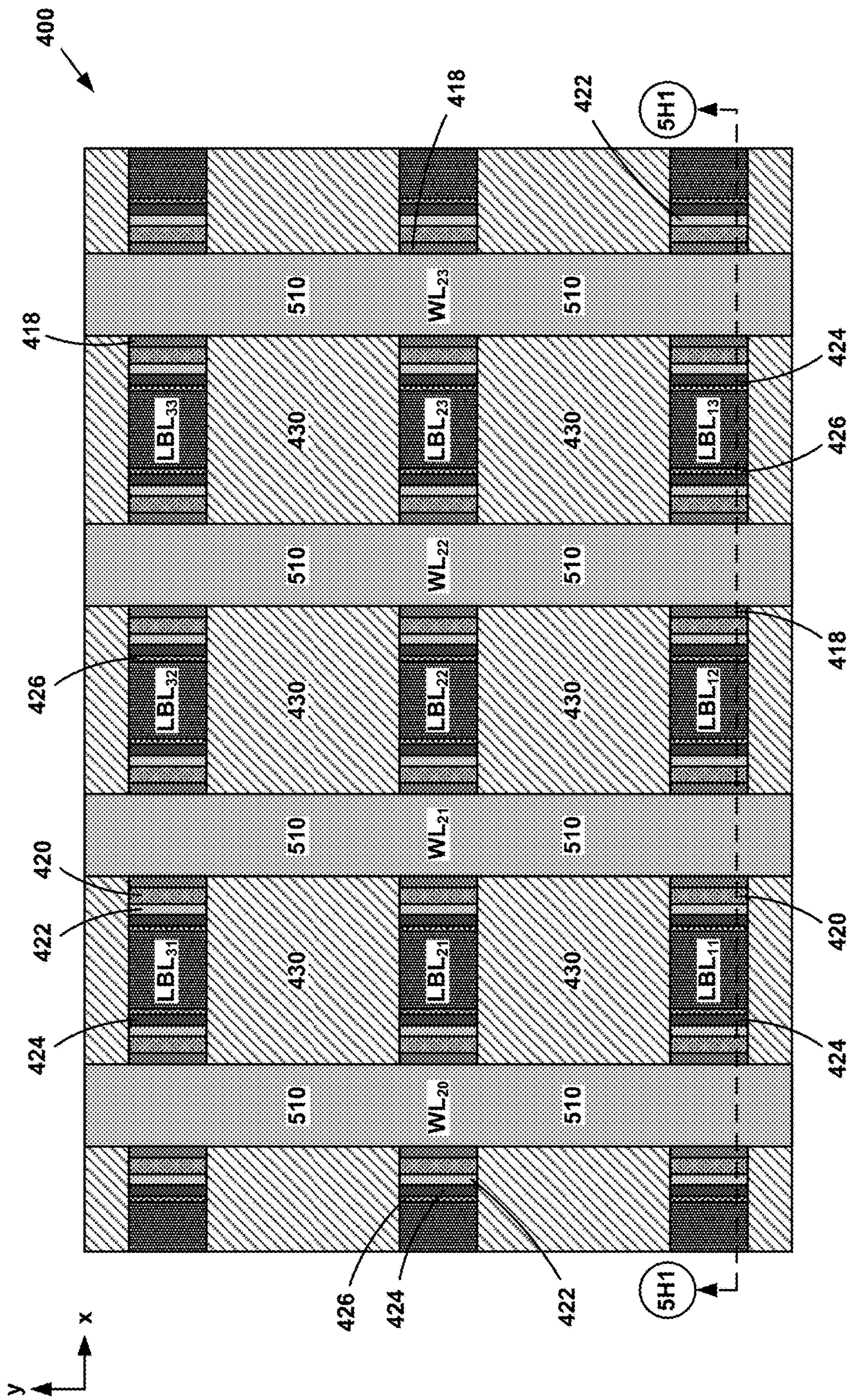
FIG. 5H3

METHODS AND APPARATUS FOR THREE-DIMENSIONAL NONVOLATILE MEMORY

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses non-volatile memory cells that include reversible resistance-switching memory elements that may be reversibly switched between a high resistance state and a low resistance state. The memory cells may be individually connected between first and second conductors (e.g., a bit line electrode and a word line electrode). The state of such a memory cell is typically changed by proper voltages being placed on the first and second conductors.

In recent years, non-volatile memory devices have been scaled to reduce the cost per bit. However, as process geometries shrink, many design and process challenges are presented.

BRIEF DESCRIPTION OF THE DRAWINGS

FIGS. 2C1-2C3 depict an embodiment of a portion of a monolithic three-dimensional memory array.

FIGS. 5A1-5H3 are cross-sectional views of a portion of a substrate during an example fabrication of the monolithic three-dimensional memory array of FIGS. 4A-4E.

DETAILED DESCRIPTION

Figure 1A:
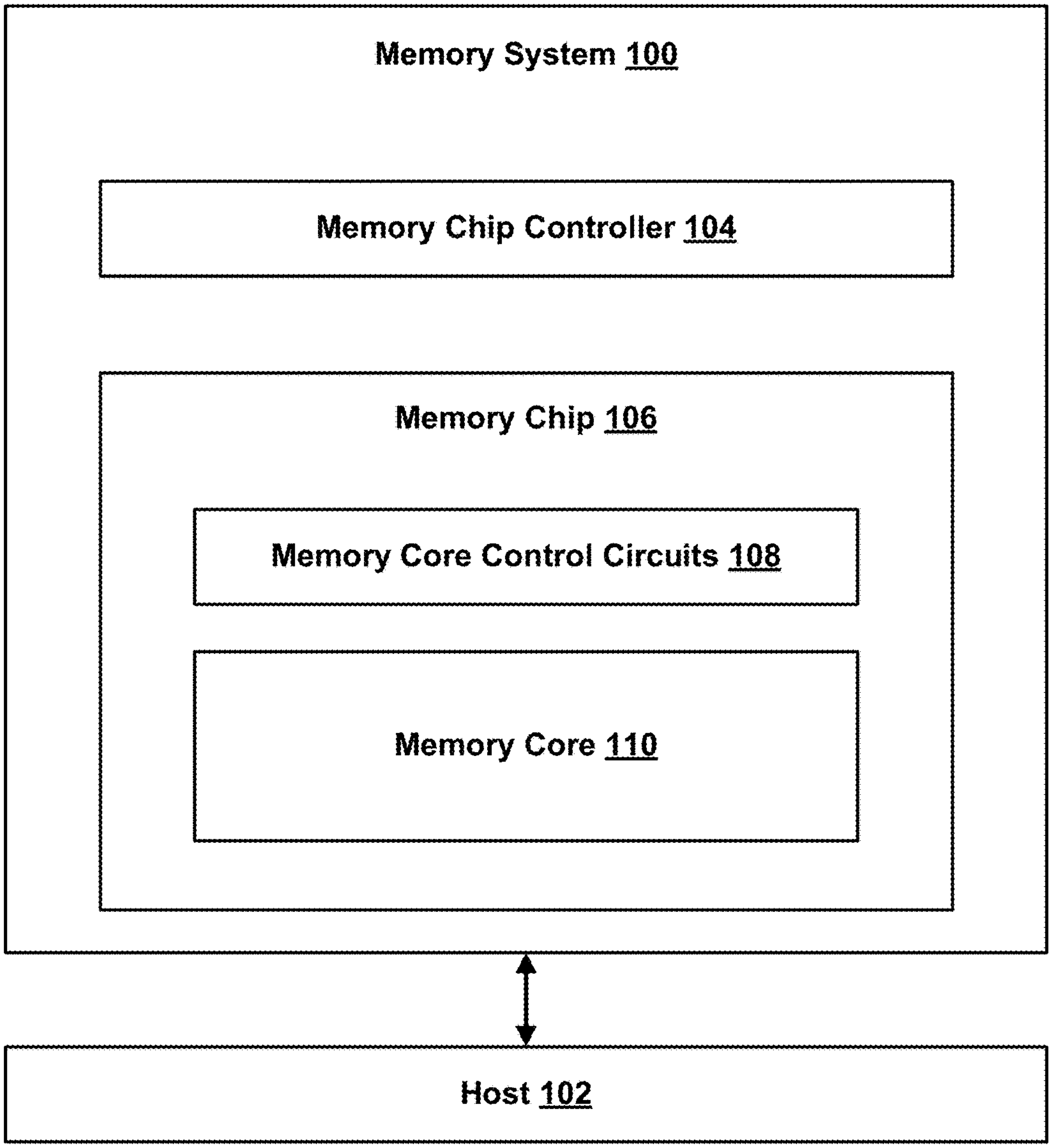
FIG. 1A depicts an embodiment of a memory system and a host.

Technology is described for including isolation elements in a non-volatile memory cell, such as a reversible resistance-switching memory cell. The non-volatile memory cell is disposed between a word line and a bit line. The non-volatile memory cell includes an isolation element that includes a semiconductor material disposed between a first conductor and a second conductor. The semiconductor material may be amorphous silicon-germanium (α-SiGe), the first conductor may be copper (Cu) and the second conductor may be titanium nitride (TiN).

In some embodiments, a memory array may include a cross-point memory array. A cross-point memory array may refer to a memory array in which two-terminal non-volatile memory cells are placed at the intersections of a first set of control lines (e.g., word lines) arranged in a first direction and a second set of control lines (e.g., bit lines) arranged in a second direction perpendicular to the first direction. The two-terminal non-volatile memory cells may include a reversible resistance-switching memory element, such as a phase change material, a ferroelectric material, or a metal oxide (e.g., hafnium oxide), disposed between first and second conductors. Example reversible resistance-switching memory elements include a phase change material, a ferroelectric material, a metal oxide (e.g., hafnium oxide), a barrier modulated switching structure, or other similar reversible resistance-switching memory elements.

Example barrier modulated switching structures include a semiconductor material layer adjacent a conductive oxide material layer (e.g., an amorphous silicon layer adjacent a crystalline titanium oxide layer). Other example barrier modulated switching structures include a thin (e.g., less than about 2 nm) barrier oxide material disposed between the semiconductor material layer and the conductive oxide material layer (e.g., an aluminum oxide layer disposed between an amorphous silicon layer and a crystalline titanium oxide layer). As used herein, a memory cell that includes a barrier modulated switching structure is referred to herein as a "barrier modulated cell" (BMC).

In some embodiments, each non-volatile memory cell in a cross-point memory array includes a reversible resistance-switching memory element in series with a steering element or an isolation element, such as one or more diodes, to reduce leakage currents. In other cross-point memory arrays, the non-volatile memory cells do not include isolation elements.

In an embodiment, a non-volatile storage system may include one or more two-dimensional arrays of non-volatile memory cells. The non-volatile memory cells within a two-dimensional memory array may form a single layer of non-volatile memory cells and may be selected via control lines (e.g., word lines and bit lines) in the X and Y directions. In another embodiment, a non-volatile storage system may include one or more monolithic three-dimensional memory arrays in which two or more layers of non-volatile memory cells may be formed above a single substrate without any intervening substrates.

In some cases, a three-dimensional memory array may include one or more vertical columns of non-volatile memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each non-volatile memory cell includes a reversible resistance-switching memory element and an isolation element in series with the reversible resistance-switching memory element. In other embodiments, each non-volatile memory cell includes a reversible resistance-switching memory element without an isolation element in series with the reversible resistance-switching memory element.

In some embodiments, a non-volatile storage system may include a non-volatile memory that is monolithically formed in one or more physical levels of arrays of non-volatile memory cells having an active area disposed above a silicon substrate. The non-volatile storage system may also include circuitry associated with the operation of the non-volatile memory cells (e.g., decoders, state machines, page registers, and/or control circuitry for controlling reading, programming and erasing of the non-volatile memory cells). The circuitry associated with the operation of the non-volatile memory cells may be located above the substrate or within the substrate.

In some embodiments, a non-volatile storage system may include a monolithic three-dimensional memory array. The monolithic three-dimensional memory array may include one or more levels of non-volatile memory cells. Each non-volatile memory cell within a first level of the one or more levels of non-volatile memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of non-volatile memory cells or one or more three-dimensional arrays of non-volatile memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
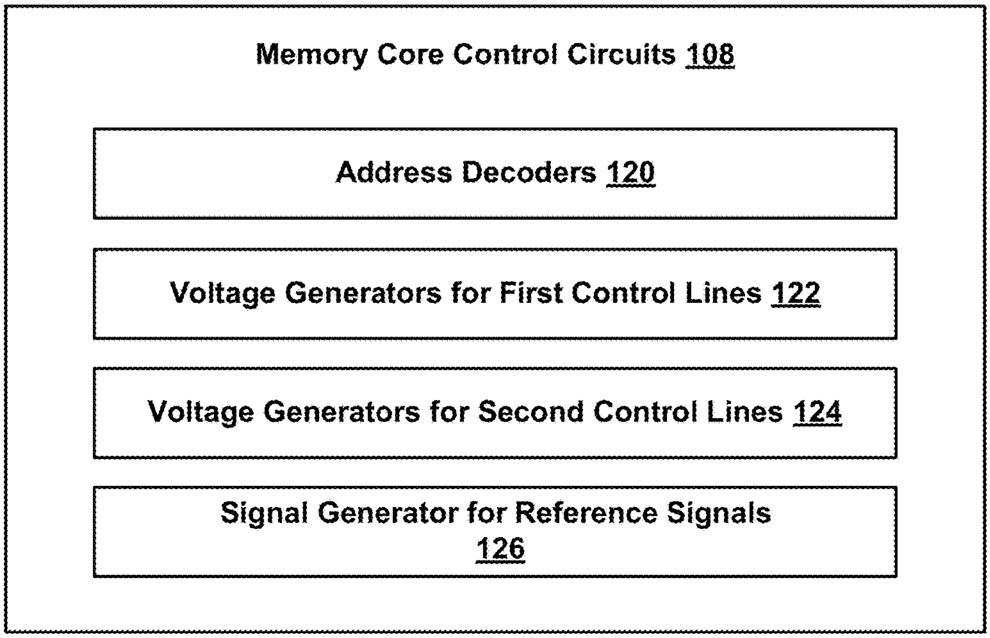
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place non-volatile memory cells into a first (e.g., selected) state. Second control lines may include second (e.g., unselected) word lines and/or second (e.g., unselected) bit lines that are used to place non-volatile memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of non-volatile memory cells, other organizations or groupings also can be used with the technology described herein.

Figure 1C:
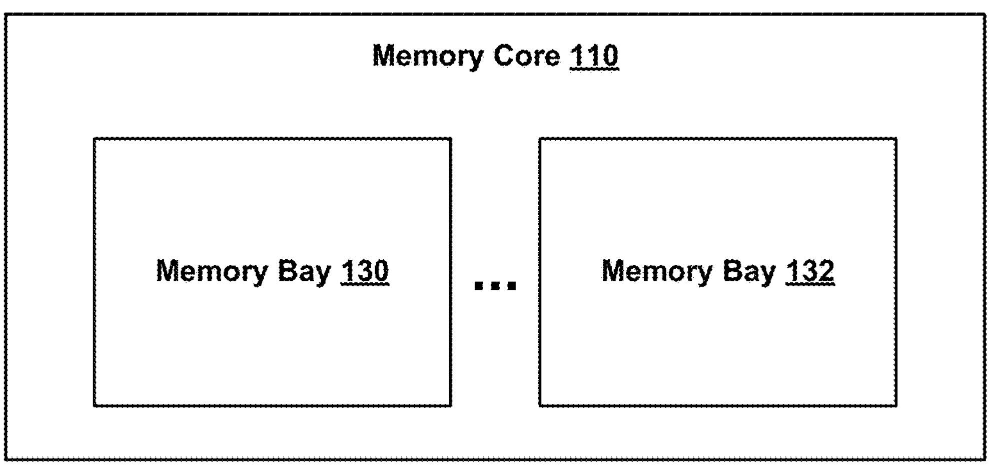
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
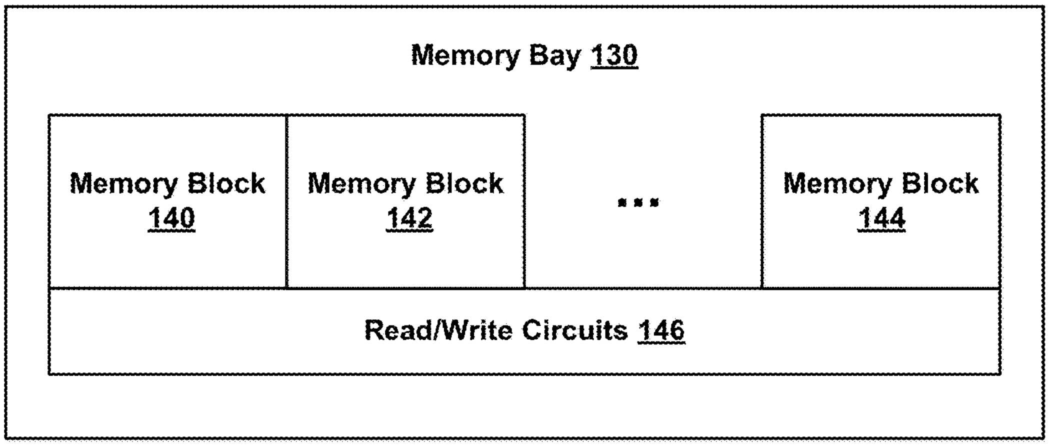
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing non-volatile memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The non-volatile memory cells within memory blocks 140-144 may permit direct over-writing of pages (i.e., data representing a page or a portion of a page may be written into memory blocks 140-144 without requiring an erase or reset operation to be performed on the non-volatile memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular non-volatile memory cell to be in one of three or more data/resistance states (i.e., the particular non-volatile memory cell may include a multi-level non-volatile memory cell). In one example, read/write circuits 146 may apply a first voltage difference (e.g., 2V) across the particular non-volatile memory cell to program the particular non-volatile memory cell into a first state of the three or more data/resistance states or a second voltage difference (e.g., 1V) across the particular non-volatile memory cell that is less than the first voltage difference to program the particular non-volatile memory cell into a second state of the three or more data/resistance states.

Applying a smaller voltage difference across the particular non-volatile memory cell may cause the particular non-volatile memory cell to be partially programmed or programmed at a slower rate than when applying a larger voltage difference. In another example, read/write circuits 146 may apply a first voltage difference across the particular non-volatile memory cell for a first time period to program the particular non-volatile memory cell into a first state of the three or more data/resistance states, and apply the first voltage difference across the particular non-volatile memory cell for a second time period less than the first time period. One or more programming pulses followed by a non-volatile memory cell verification phase may be used to program the particular non-volatile memory cell to be in the correct state.

Figure 1E:
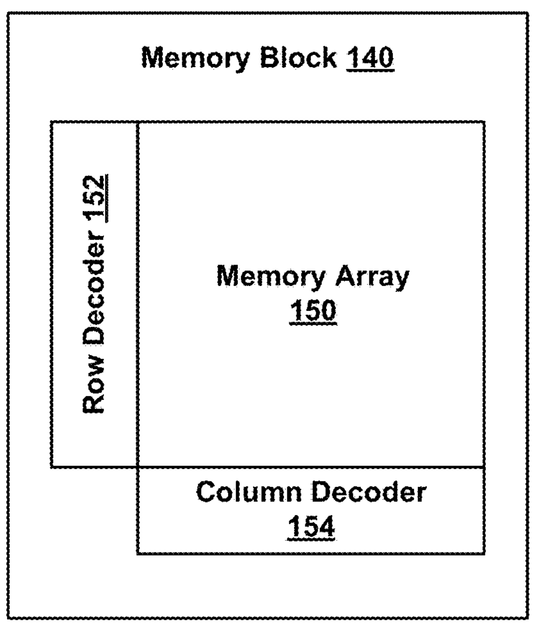
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of non-volatile memory cells having contiguous word lines and bit lines. Memory array 150 may include one or more layers of non-volatile memory cells. Memory array 150 may include a two-dimensional memory array or a three-dimensional memory array.

Row decoder 152 decodes a row address and selects a particular word line in memory array 150 when appropriate (e.g., when reading or writing non-volatile memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M non-volatile memory cells.

Figure 1F:
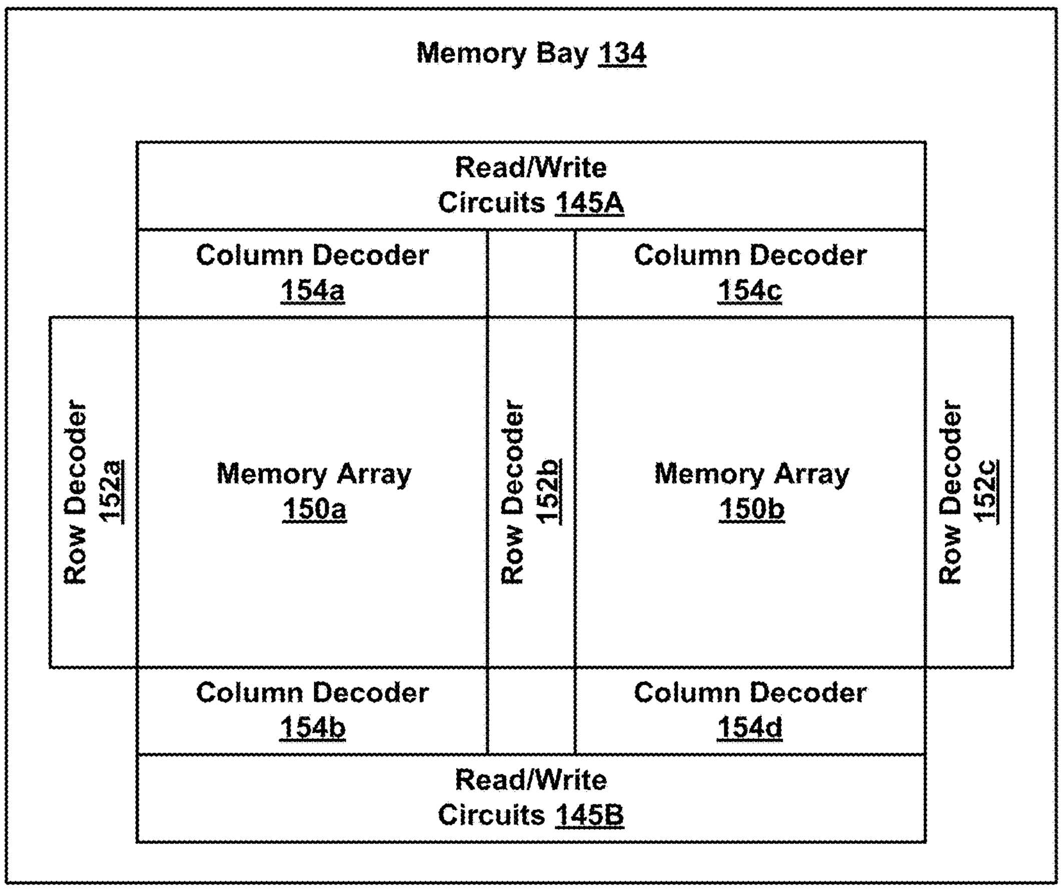
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152*b* is shared between memory arrays 150*a* and 150*b* because row decoder 152*b* controls word lines in both memory arrays 150*a* and 150*b* (i.e., the word lines driven by row decoder 152*b* are shared).

Row decoders 152*a* and 152*b* may be split such that even word lines in memory array 150*a* are driven by row decoder 152*a* and odd word lines in memory array 150*a* are driven by row decoder 152*b*. Row decoders 152*c* and 152*b* may be split such that even word lines in memory array 150*b* are driven by row decoder 152*c* and odd word lines in memory array 150*b* are driven by row decoder 152*b*.

Column decoders 154*a* and 154*b* may be split such that even bit lines in memory array 150*a* are controlled by column decoder 154*b* and odd bit lines in memory array 150*a* are driven by column decoder 154*a*. Column decoders 154*c* and 154*d* may be split such that even bit lines in memory array 150*b* are controlled by column decoder 154*d* and odd bit lines in memory array 150*b* are driven by column decoder 154*c*.

The selected bit lines controlled by column decoder 154*a* and column decoder 154*c* may be electrically coupled to read/write circuits 146*a*. The selected bit lines controlled by column decoder 154*b* and column decoder 154*d* may be electrically coupled to read/write circuits 146*b*. Splitting the read/write circuits into read/write circuits 146*a* and 146*b* when the column decoders are split may allow for a more efficient layout of the memory bay.

Figure 2A:
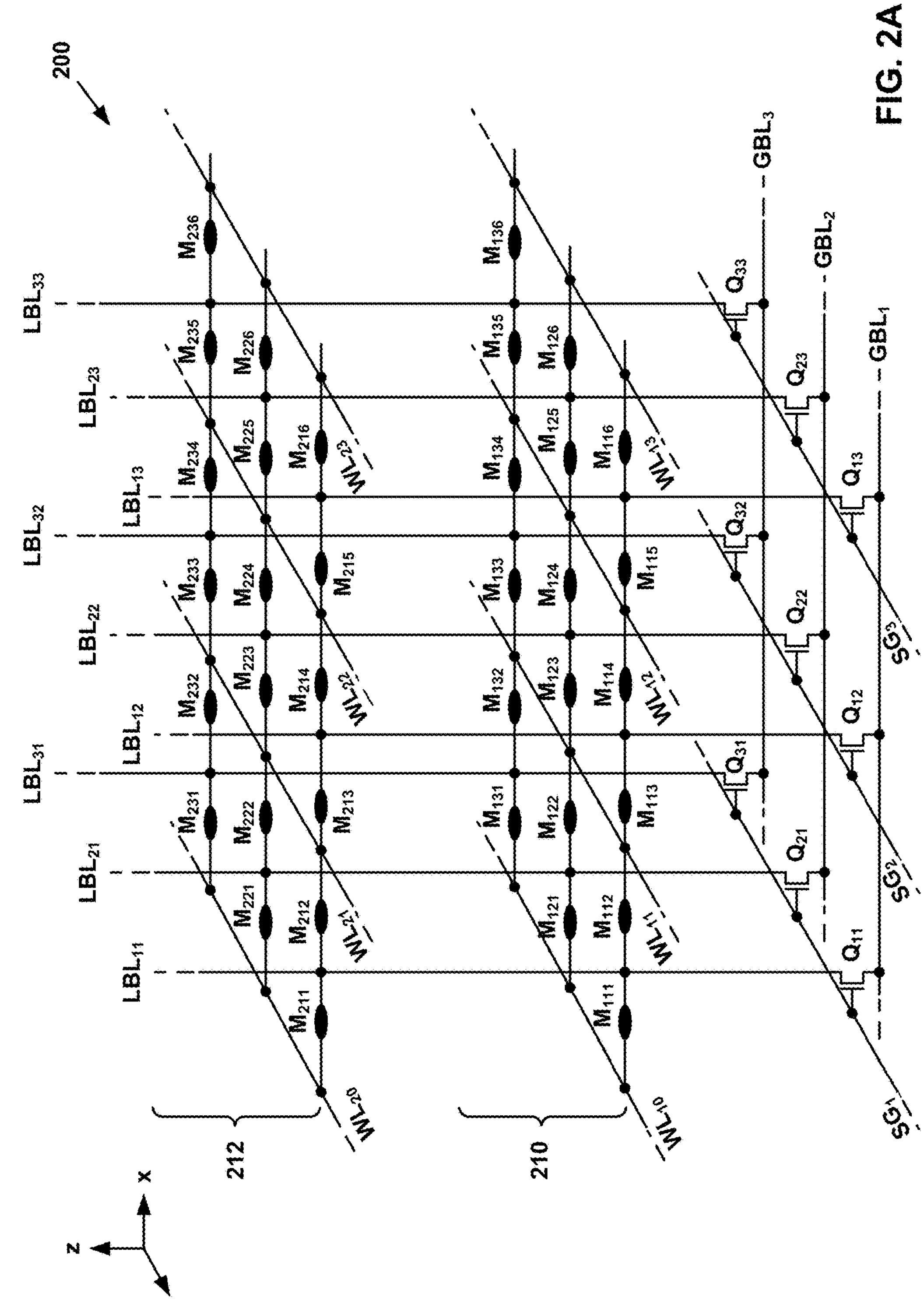
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular non-volatile memory cell (e.g., non-volatile memory cell $M_{111}$ is disposed between local bit line $LBL_{11}$ and word line $WL_{10}$). The particular non-volatile memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{33}$) is biased to global bit lines $GBL_1$-$GBL_3$, the other local bit lines (e.g., $LBL_{32}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{33}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as memory array 200, includes a greater number of non-volatile memory cells along the word lines as compared with the number of non-volatile memory cells along the vertical bit lines (e.g., the number of non-volatile memory cells along a word line may be more than 10 times the number of non-volatile memory cells along a bit line). In one example, the number of non-volatile memory cells along each bit line may be 16 or 32, whereas the number of non-volatile memory cells along each word line may be 2048 or more than 4096. Other numbers of non-volatile memory cells along each bit line and along each word line may be used.

In an embodiment of a read operation, the data stored in a selected non-volatile memory cell (e.g., non-volatile memory cell $M_{111}$) may be read by biasing the word line connected to the selected non-volatile memory cell (e.g., selected word line $WL_{10}$) to a selected word line voltage in read mode (e.g., 0V). The local bit line (e.g., $LBL_{11}$) coupled to the selected non-volatile memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected non-volatile memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected non-volatile memory cell (e.g., non-volatile memory cell $M_{221}$) by biasing the word line connected to the selected non-volatile memory cell (e.g., $WL_{20}$) to a selected word line voltage in write mode (e.g., 5V). The local bit line (e.g., $LBL_{21}$) coupled to the selected non-volatile memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

Figure 2B:
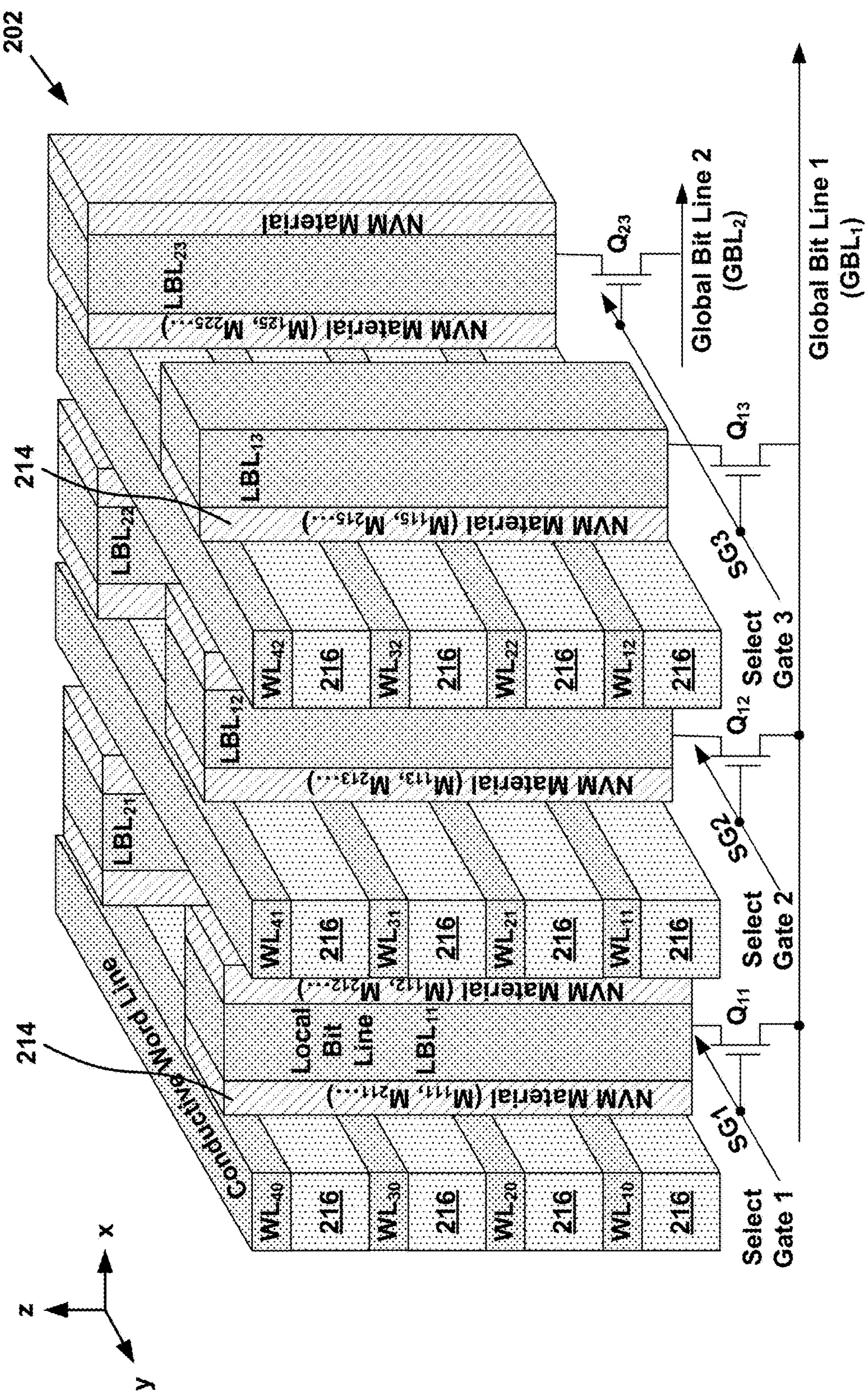
FIG. 2B depicts an embodiment of a portion of a monolithic three-dimensional memory array that includes a non-volatile memory material.

FIG. 2B depicts an embodiment of a portion of a monolithic three-dimensional memory array 202 that includes a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, . . . , $WL_{42}$ that are formed in a first direction (e.g., an x-direction), vertical bit lines $LBL_{11}$, $LBL_{12}$, $LBL_{13}$, . . . , $LBL_{33}$ that are formed in a second direction perpendicular to the first direction (e.g., a z-direction), and non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, . . . , $WL_{42}$.

Non-volatile memory material 214 may include, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or a charge trapping material (e.g., a layer of silicon nitride). In an embodiment, non-volatile memory material 214 may include a single continuous layer of material that may be used by a plurality of non-volatile memory cells or devices.

In an embodiment, portions of non-volatile memory material 214 may include a part of a first non-volatile memory cell associated with the cross section between $WL_{12}$ and $LBL_{13}$ and a part of a second non-volatile memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, . . . , $LBL_{33}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

Figure 3A:
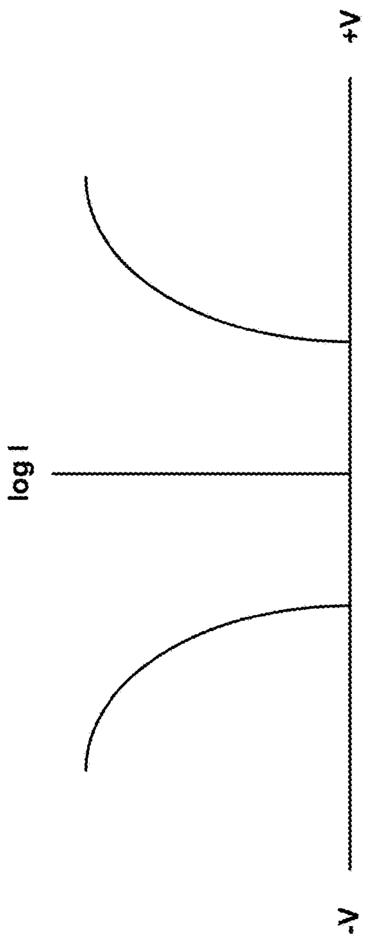
FIG. 3A depicts a diagram of an example current versus voltage characteristic for an example isolation element.

FIGS. 2C1-2C3 depict an embodiment of a portion of a monolithic three-dimensional memory array 204 that includes a first memory level 218, a second memory level 220 positioned above first memory level 218, a third memory level 222 positioned above second memory level 220, and a fourth memory level 224 positioned above third memory level 222. Memory array 204 is one example of an implementation for memory array 150 of FIG. 1E.

As depicted, disposed between the intersection of each local bit line and each word line is a particular non-volatile memory cell. For example, non-volatile memory cell $M_{111}$ is disposed between local bit line $LBL_{11}$ and word line $WL_{10}$, non-volatile memory cell $M_{225}$ is disposed between local bit line $LBL_{23}$ and word line $WL_{22}$, and non-volatile memory cell $M_{433}$ is disposed between local bit line $LBL_{32}$ and word line $WL_{41}$.

In an embodiment, each non-volatile memory cell includes a reversible resistance-switching memory element coupled in series with an isolation element. For example, non-volatile memory cell $M_{414}$ includes reversible resistance-switching memory element $R_{414}$ coupled in series with isolation element $S_{414}$, non-volatile memory cell $M_{321}$ includes reversible resistance-switching memory element $R_{321}$ coupled in series with isolation element $S_{321}$, and non-volatile memory cell $M_{233}$ includes reversible resistance-switching memory element $R_{233}$ coupled in series with isolation element $S_{233}$.

In an embodiment, each of isolation elements $S_{111}$-$S_{436}$ of monolithic three-dimensional memory array 204 exhibits an ON-state current density of greater than about 1-5 $MA/cm^2$, an OFF-state leakage current of less than about 10-20 nA@1V, and an ON/OFF current ratio of greater than about 500. In addition, in an embodiment, each of isolation elements $S_{111}$-$S_{436}$ of monolithic three-dimensional memory array 204 exhibits bipolar operation, such as depicted in the current versus voltage diagram depicted in FIG. 3A.

Figure 3B:
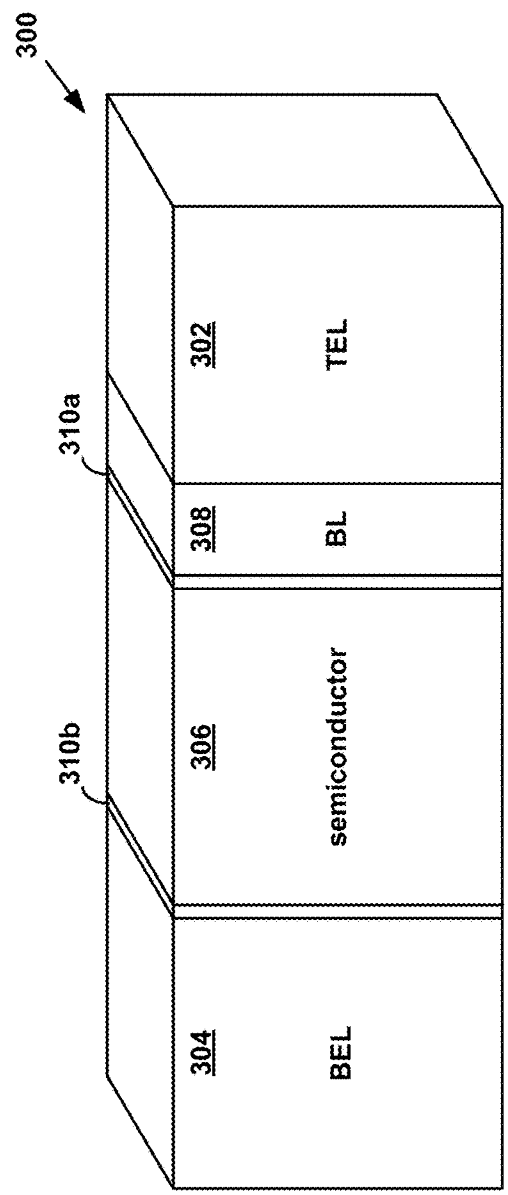
FIG. 3B depicts an embodiment of an isolation element.

FIG. 3B is a diagram of a perspective view of an embodiment of an isolation element 300. Isolation element 300 is one example of an implementation for isolation elements $S_{111}$-$S_{436}$ of FIG. 2C1-2C3. Isolation element 300 includes a first electrode 302 and a second electrode 304, with a semiconductor layer 306 and a barrier layer 308 disposed between first electrode 302 and second electrode 304. First electrode 302 also may be referred to as a top electrode (TEL), and second electrode 304 also may be referred to as a bottom electrode (BEL).

Isolation element optionally may include a first capping layer 310*a* disposed between semiconductor layer 306 and barrier layer 308, and a second capping layer 310*b* disposed between semiconductor layer 306 and second electrode 304. Although depicted in FIG. 3B in a horizontal orientation, isolation element 300 alternatively may be arranged in other orientations, such as a vertical orientation (e.g., by rotating isolation element 300 clockwise or counterclockwise by 90 degrees) or other orientation.

In an embodiment, first electrode 302 is Cu, with a thickness of between about 10 nm and about 100 nm, second electrode 304 is TiN, with a thickness of between about 10 nm and about 100 nm, semiconductor layer 306 is silicon-germanium ($Si_xGe_{1-x}$, with x between about 0.3 to about 0.7), with a thickness of between about 5 nm and about 20 nm, and barrier layer 308 is tantalum nitride (TaN), with a thickness of between about 1 nm and about 5 nm. Optional first capping layer 310*a* and second capping layer 310*b* each may be silicon, with a thickness of between about 1 nm and about 5 nm. Other materials, thicknesses and ratios may be used.

In an embodiment, semiconductor layer 306 is amorphous silicon-germanium ($\alpha$-$Si_xGe_{1-x}$), and can be deposited by low pressure chemical vapor deposition (LPCVD), plasma-enhanced chemical vapor deposition (PECVD), physical vapor deposition (PVD) (e.g., sputtering), or other process. Amorphous silicon ($\alpha$-Si) is a non-crystalline form of silicon in which the silicon atoms form a continuous random network. Alternatively, semiconductor layer 306 may be polycrystalline silicon-germanium. In embodiments, semiconductor layer 306 may be one or more of silicon, germanium, $Si_xGe_{1-x}$ or other similar semiconductor materials or low density oxides such as hafnium oxide ($HfO_2$), silicon oxide ($SiO_x$), titanium oxide ($TiO_2$), tungsten oxide (WO), zinc oxide ZnO or other similar low density oxides. In embodiments, semiconductor layer 306 may be a doped or an undoped semiconductor material, and may be amorphous or polycrystalline.

In other embodiments, first electrode 302 may be one or more of Cu, silver (Ag), nickel (Ni) or other metal, second electrode 304 may be one or more of TiN, a conductive carbon, platinum (Pt), ruthenium (Ru), palladium (Pd), iridium (Ir), titanium aluminum nitride (TiAlN), tungsten (W), or other conductive material, barrier layer 308 may be one or more of titanium (Ti), tantalum (Ta), TiN, TaN, tungsten nitride (WN), tantalum carbide (TaC), or other barrier layer material, first capping layer 310*a* and second capping layer 310*b* may be $SiO_x$, aluminum oxide ($Al_2O_3$), or other similar material. In other embodiments, another metal cap layer such as TaN, TiN, Al, etc., may be added on top of first electrode 302 for better current confinement during switching/cycling and improved Cu ionization. For simplicity, the remaining description assumes that first electrode 302 is copper, second electrode 304 is TiN, semiconductor layer 306 is a-$Si_xGe_{1-x}$, and barrier layer 308 is TaN.

Figure 3C:
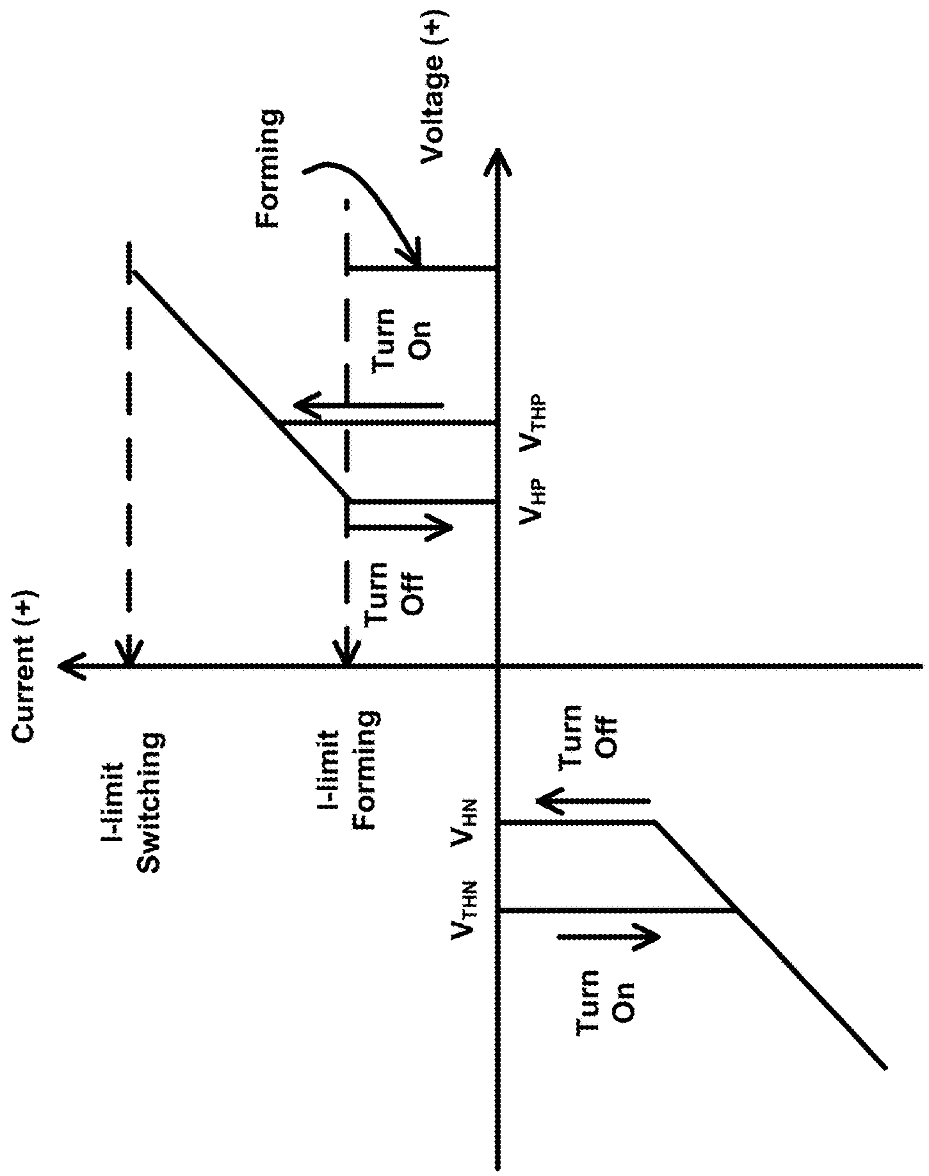
FIG. 3C depicts an example current-voltage characteristic of the isolation element of FIG. 3B.

In an embodiment, isolation element 300 operates as a threshold switching device. FIG. 3C is a diagram depicting example current-voltage (I-V) characteristics for isolation element 300. Each isolation element 300 is initially in a high resistance (OFF) state. To operate isolation element 300 as a threshold switch, an initial forming step may be necessary so that isolation element 300 operates in a current range in which switching can occur. In an example forming process, a positive voltage pulse or sweep is applied to first electrode 302, while second electrode 304 is grounded.

Without wanting to be bound by any particular theory, and assuming that first electrode 302 is Cu, it is believed that during forming, voltage induced migration of Cu ions takes place from the TEL (TEL acts as an ion source) towards the BEL. As a result, it is believed that a metallic Cu filament is formed due to an electrochemical reaction which changes a resistance of the cell. A forming bias condition is chosen to obtain a desired cell conductivity, which is monitored by a cell current (ICELL) measurement after each pulse (or during a voltage sweep). In an embodiment, a target ICELL (@1V) is in the range of between about 50 nA and about 200 nA. It is believed that after the initial positive forming, segregated Cu at the BEL may serve as reservoir and act as cation injector (virtual Cu electrode) for negative polarity switching.

In an embodiment, a forming step uses an incremental step pulse program (ISPP) algorithm in which a voltage amplitude is increased gradually for a fixed pulse width with I-limit Forming (FIG. 3C) set to a desired value (e.g. values are between about 5 μA and about 50 μA) and ICELL is monitored after each pulse. In an embodiment, the pulse width may be looped until ICELL reaches the target range. Example forming parameters are specified in Table 1:

Table 1: Example Forming Parameters

TABLE 1

EXAMPLE FORMING PARAMETERS

| PARAMETER | EXAMPLE VALUES |
|---|---|
| Pulse Magnitude (V) | 3-6 |
| Pulse Duration (μsec) | 1-10 |
| Pulse Rise Time (nsec) | 20-200 |
| ICELL (@ 1 V) (nA) | 50-200 |

Persons of ordinary skill in the art will understand that forming pulses may be current pulses, and that other pulse magnitude, pulse duration, pulse rise time and Iverify values may be used. Persons of ordinary skill in the art will understand that the forming step may be performed using multiple pulse (burst mode), DC sweep, multilevel soft forming, a combination of forward and reverse forming (e.g., for better filament control), or other similar forming methods.

Following the forming step, voltage (or current) pulses may be applied to isolation element 300 to switch isolation element 300 ON or OFF. In an embodiment, if positive voltage pulses exceeding a first threshold voltage $V_{THP}$ are applied to first electrode 302 while second electrode 304 is grounded, isolation element 300 switches from OFF to ON, and stays ON until the voltage pulse falls below a first hold voltage, $V_{HP}$.

For positive polarity switching, an ISPP algorithm is used in which the pulse voltage is incremented (positive) and the pulse current is measured (e.g., using an oscilloscope) until an "I-limit switching" point is reached, as illustrated in FIG. 3C. A sudden current jump is observed at $V_{THP}$ and the cell moves to an low resistance state (LRS) (sometimes called an ON state). In an embodiment, "I-limit-switching" is between about 40 μA and about 150 μA. In an embodiment, after the cell has reached "I-limit switching," the pulse voltage amplitude is decremented to move the cell to a high resistance state (HRS) (sometimes called an OFF state).

In an embodiment, during this sequence of pulsing, the pulse current is also measured (e.g., using an oscilloscope). In an embodiment, a sharp drop in current is observed at $V_{HP}$ (Holding Voltage) and the cell moves to the OFF state. In an embodiment, after each pulse (increment/decrement) ICELL@VREAD is monitored to check cell damage. In embodiments, VREAD=1V or other value, typically much less than $V_{THP}$. In an embodiment, this completes one cycle (in positive polarity) of threshold switching (TS) of the cell from the TEL side.

In embodiments, first threshold voltage $V_{THP}$ may be between about 1.2 V and about 2.5 V, and first hold voltage $V_{HP}$ may be between about 1.0 V and about 2 V, although other values may be obtained based on the switching algorithm that is used. In an embodiment, voltage (or current) pulses having a trapezoidal shape (e.g., rise time less than fall time) are used, although other pulse shapes may be used. In embodiments, between about 10 to about 50 positive threshold switching operations are performed before opposite polarity (negative polarity) switching is started so that there is enough segregated Cu available in the BEL reservoir and in the SiGe system to enable stable bipolar threshold switching I-V characteristics, such as shown in FIG. 3C. This can be called cell "training" or "stabilization."

In another embodiment, if positive voltage pulses exceeding a second threshold voltage $V_{THN}$ are applied to second electrode 304 while first electrode 302 is grounded, isolation element 300 switches from OFF to ON, and stays ON until the voltage pulse falls below a second hold voltage, $V_{HN}$. In an embodiment, for reverse operation of the cell the same flow as described above is used with voltage pulses applied from the BEL. This will result in the negative I-V characteristic shown in FIG. 3C.

In embodiments, second threshold voltage $V_{THN}$ may be between about 1.5V and about 2.7 V, and second hold voltage $V_{HN}$ may be between about 1.2V and about 2 V, although other values may be used. In an embodiment, voltage (or current) pulses having a trapezoidal shape (e.g., rise time less than fall time) are used, although other pulse shapes may be used.

Without wanting to be bound by any particular theory, it is believed that first electrode 302 may function as an active electrode (ion source), semiconductor layer 306 may function as an ion conducting layer (solid electrolyte), barrier layer 308 may limit ion movement from first electrode 302 to semiconductor layer 306 (solid electrolyte) during switching and may function as a local resistor to limit capacitive surge currents during switching, second electrode 304 may function as a counter-electrode, and first capping layer 310*a* and second capping layer 310*b* may prevent germanium loss due to subsequent process steps and may act as tunnel barrier that may further reduce IOFF. Second capping layer 310*b* also may acts as a seed layer for the $\alpha$-$Si_xGe_{1-x}$.

In an embodiment, during fabrication of isolation element 300, semiconductor layer 306 is annealed in $H_2$ (30-50%) at a temperature of between about 350° C. and about 450° C. for between about 30 minutes and about 120 minutes. Other temperatures and processing times may be used. Without wanting to be bound by any particular theory, it is believed that annealing isolation element 300 may reduce leakage current of isolation element 300 by reducing the trap levels in $\alpha$-$Si_xGe_{1-x}$, for example, from several hundreds of nano-amps without annealing to tens of nano-amps with annealing. Other leakage current values may be used.

In an embodiment, the above-specified anneal may be performed immediately after silicon deposition. Other anneals such as an $H_2/D_2$ high pressure anneal (HPA) (e.g., 9-20 atm/30 min./350 C) also can be employed to achieve similar or better results. HPA is particularly useful as it is normally done at lower temperature than furnace anneal and may be employed after the complete processing of a wafer.

Referring again to FIGS. 2C1-2C3, isolation elements $S_{111}$-$S_{436}$ are each coupled between one of local bit lines $LBL_{11}$-$LBL_{33}$ and a corresponding one of reversible resistance-switching memory elements $R_{111}$-$R_{436}$, respectively. Accordingly, in an embodiment, each of isolation elements $S_{111}$-$S_{436}$ may include one of isolation elements 300 of FIG. 3B, with local bit lines $LBL_{11}$-$LBL_{33}$ forming a first electrode 302 of each isolation element $S_{111}$-$S_{436}$.

The monolithic three-dimensional memory array 204 illustrated in FIGS. 2C1-2C3 includes vertical bit lines and horizontal word lines. The technology described above also may be used in other monolithic three-dimensional memory array configurations. For example, a cross-point memory array may include non-volatile memory cells each having a reversible resistance-switching memory element coupled in series with an isolation element such as isolation element 300 described above and illustrated in FIG. 3B.

FIGS. 4A-4E depict various views of an embodiment of a portion of a monolithic three-dimensional memory array 400 that includes a non-volatile memory material. The physical structure depicted in FIGS. 4A-4E may include one implementation for a portion of the monolithic three-dimensional memory array depicted in FIG. 2A.

Monolithic three-dimensional memory array 400 includes vertical bit lines $LBL_{11}$-$LBL_{33}$ arranged in a first direction (e.g., a z-direction), word lines $WL_{10}$, $WL_{11}$, . . . , $WL_{43}$ arranged in a second direction (e.g., an x-direction) perpendicular to the first direction, row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions. Vertical bit lines $LBL_{11}$-$LBL_{33}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 400 may include more or fewer than twenty-four word lines, three row select lines, three global bit lines, and nine vertical bit lines.

In an embodiment, global bit lines $GBL_1$, $GBL_2$, $GBL_3$ are disposed above a substrate 402, such as a silicon, germanium, silicon-germanium, undoped, doped, bulk, silicon-on-insulator ("SOP") or other substrate with or without additional circuitry. In an embodiment, an isolation layer 404, such as a layer of silicon dioxide, silicon nitride, silicon oxynitride or any other suitable insulating layer, is formed above substrate 402. In an embodiment, global bit lines $GBL_1$, $GBL_2$, $GBL_3$ are formed of a conductive material 406, such as tungsten or another appropriate metal, heavily doped semiconductor material, a conductive silicide, a conductive silicide-germanide, a conductive germanide, or the like deposited by any suitable method (e.g., CVD, PVD, etc.).

In an embodiment, a first dielectric material layer 408 (e.g., silicon dioxide) and a second dielectric material layer 410 (e.g., silicon dioxide) are formed above isolation layer 404. Global bit lines $GBL_1$, $GBL_2$, $GBL_3$ are disposed above isolation layer 404 and are separated from one another by first dielectric material layer 408. Row select lines $SG_1$, $SG_2$, $SG_3$ are disposed above global bit lines $GBL_1$, $GBL_2$, $GBL_3$. A first etch stop layer 412 (e.g., silicon nitride) is disposed above second dielectric material layer 410. A stack of word lines $WL_{10}$, $WL_{11}$, . . . , $WL_{43}$ is disposed above first etch stop layer 412, with a third dielectric material layer 414 (e.g., silicon dioxide) separating adjacent word lines.

A non-volatile memory cell is disposed between the intersection of vertical bit lines $LBL_{11}$-$LBL_{33}$ and word lines $WL_{10}$, $WL_{11}$, . . . , $WL_{43}$. For example, a non-volatile memory cell $M_{111}$ is disposed between vertical bit line $LBL_{11}$ and word line $WL_{10}$, a non-volatile memory cell $M_{116}$ is disposed between vertical bit line $LBL_{13}$ and word line $WL_{13}$, a non-volatile memory cell $M_{411}$ is disposed between vertical bit line $LBL_{11}$ and word line $WL_{40}$, and so on. In an embodiment, monolithic three-dimensional memory array 400 includes seventy-two non-volatile memory cells $M_{111}$, $M_{112}$, . . . , $M_{436}$. Persons of ordinary skill in the art will understand that monolithic three-dimensional memory arrays may include more or fewer than seventy-two non-volatile memory cells.

In an embodiment, each of non-volatile memory cells $M_{111}$, $M_{112}$, . . . , $M_{436}$ includes a corresponding reversible resistance-switching memory element $R_{111}$, $R_{112}$, . . . , $R_{436}$, respectively, coupled in series with a corresponding isolation element $S_{111}$, $S_{112}$, . . . , $S_{436}$, respectively. For example, non-volatile memory cell $M_{111}$ includes reversible resistance-switching memory element $R_{111}$ coupled in series with isolation element $S_{111}$, non-volatile memory cell $M_{411}$ includes reversible resistance-switching memory element $R_{411}$ coupled in series with isolation element $S_{411}$, non-volatile memory cell $M_{116}$ includes reversible resistance-switching memory element $R_{116}$ coupled in series with isolation element $S_{116}$, and so on.

Each reversible resistance-switching memory element $R_{111}$, $R_{112}$, . . . , $R_{436}$ may include a single material layer or multiple material layers. In an embodiment, each reversible resistance-switching memory element $R_{111}$, $R_{112}$, . . . , $R_{436}$ includes a barrier modulated switching structure that includes a semiconductor material layer 418 and a conductive oxide material layer 420. A barrier material layer (e.g., about 2 nm of $Al_2O_3$) (not shown) may be disposed between semiconductor material layer 418 and conductive oxide material layer 420.

In embodiments, semiconductor material layer 418 includes between about 3 nm and about 8 nm of one or more of amorphous silicon, amorphous tantalum nitride, amorphous tantalum silicon nitride, or other similar semiconductor material, and conductive oxide material layer 420 includes between about 6 nm and about 12 nm of one or more of crystalline titanium oxide, crystalline zinc oxide, crystalline tungsten oxide, crystalline strontium titanate, yttria-stabilized zirconia, crystalline praseodymium calcium manganese oxide, or other similar conductive oxide material. Other semiconductor materials and/or conductive oxide materials may be used. As described above, a BMC memory cell includes a barrier modulated switching structure.

In an embodiment, each of isolation elements $S_{111}$, $S_{112}$, . . . , $S_{436}$, is an isolation element 300 of FIG. 3B, and includes a portion of a bit line (corresponding to first electrode 302 in FIG. 3B), a conductive material layer 422 (corresponding to second electrode 304 in FIG. 3B), a semiconductor material 424 (corresponding to semiconductor layer 306 in FIG. 3B), and a barrier material 426 (corresponding to barrier layer 308 in FIG. 3B).

In an embodiment, vertical bit lines $LBL_{11}$-$LBL_{33}$ are Cu, conductive material layer 422 is TiN, with a thickness of between about 10 nm and about 50 nm, semiconductor material 424 is α-silicon-germanium (α-$Si_xGe_{1-x}$, with x between about 0.3 to about 0.7), with a thickness of between about 5 nm and about 15 nm, and barrier material 426 is TaN, with a thickness of between about 1 nm and about 5 nm. Although not shown in FIGS. 4A-4E, a first capping layer may be disposed between semiconductor material 424 and barrier material 426, and a second capping layer may be disposed between semiconductor material 424 and conductive material layer 422.

In other embodiments, vertical bit lines $LBL_{11}$-$LBL_{33}$ may be one or more of Cu, Ag, Ni or other metal, semiconductor material 424 may be one or more of silicon, germanium, $Si_xGe_{1-x}$ or other similar semiconductor materials or low density oxides such as $HfO_2$, $SiO_x$, $TiO_2$, WO, ZnO, or other similar low density oxides, conductive material layer 422 may be one or more of TiN, a conductive carbon, Pt, Ru, Pd, Ir, TiAlN, W, or other conductive material, and barrier material 426 may be one or more of Ti, Ta, TiN, TaN, WN, TaC, or other barrier layer material. For simplicity, the remaining description assumes that first electrode 302 is copper, second electrode 304 is TiN, semiconductor layer 306 is α-$Si_xGe_{1-x}$, and barrier layer 308 is tantalum nitride.

Vertical bit lines $LBL_{11}$-$LBL_{33}$ are separated from one another by a fourth dielectric material layer 430 (e.g., silicon dioxide). In some embodiments, each of vertical bit lines $LBL_{11}$-$LBL_{33}$ includes a vertical structure (e.g., a rectangular prism, a cylinder, or a pillar), and semiconductor material 424 and barrier material 426 may completely or partially surround the vertical structure (e.g., a conformal layer of material surrounding the sides of the vertical structure).

Vertically-oriented bit line select transistors $Q_{11}$-$Q_{33}$ may be used to select a corresponding one of vertical bit lines $LBL_{11}$-$LBL_{33}$. Vertically-oriented bit line select transistors $Q_{11}$-$Q_{33}$ may be field effect transistors, although other transistors types may be used. Each of vertically-oriented bit line select transistors $Q_{11}$-$Q_{33}$ has a first terminal (e.g., a drain/source terminal), a second terminal (e.g., a source/drain terminal), a first control terminal (e.g., a first gate terminal) and a second control terminal (e.g., a second gate terminal).

The first gate terminal and the second gate terminal may be disposed on opposite sides of the vertically-oriented bit line select transistor. The first gate terminal may be used to selectively induce a first conductive channel between the first terminal and the second terminal of the transistor, and the second gate terminal may be used to selectively induce a second conductive channel between the first terminal and the second terminal of the transistor.

In an embodiment, the first gate terminal and the second gate terminal are coupled together to form a single control terminal that may be used to collectively turn ON and OFF the vertically-oriented bit line select transistor. Thus, the first gate terminal and the second gate terminal of each of vertically-oriented bit line select transistors $Q_{11}$-$Q_{33}$ may be used to select a corresponding one of vertical bit lines $LBL_{11}$, $LBL_{12}$, . . . , $LBL_{33}$.

Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Figure 4A:
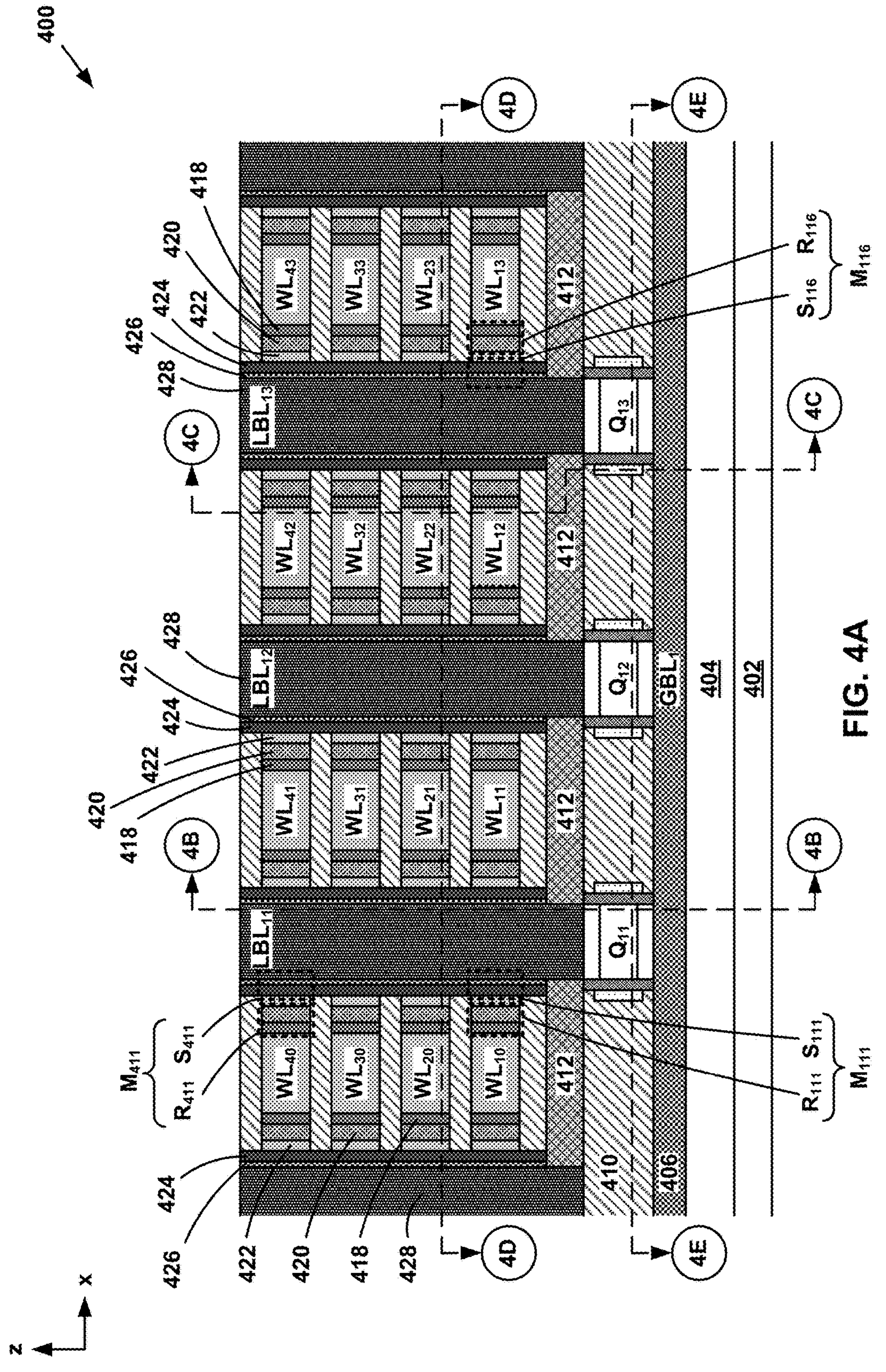
FIG. 4A-4E depict various views of an embodiment monolithic three-dimensional memory array.
Figure 4B:
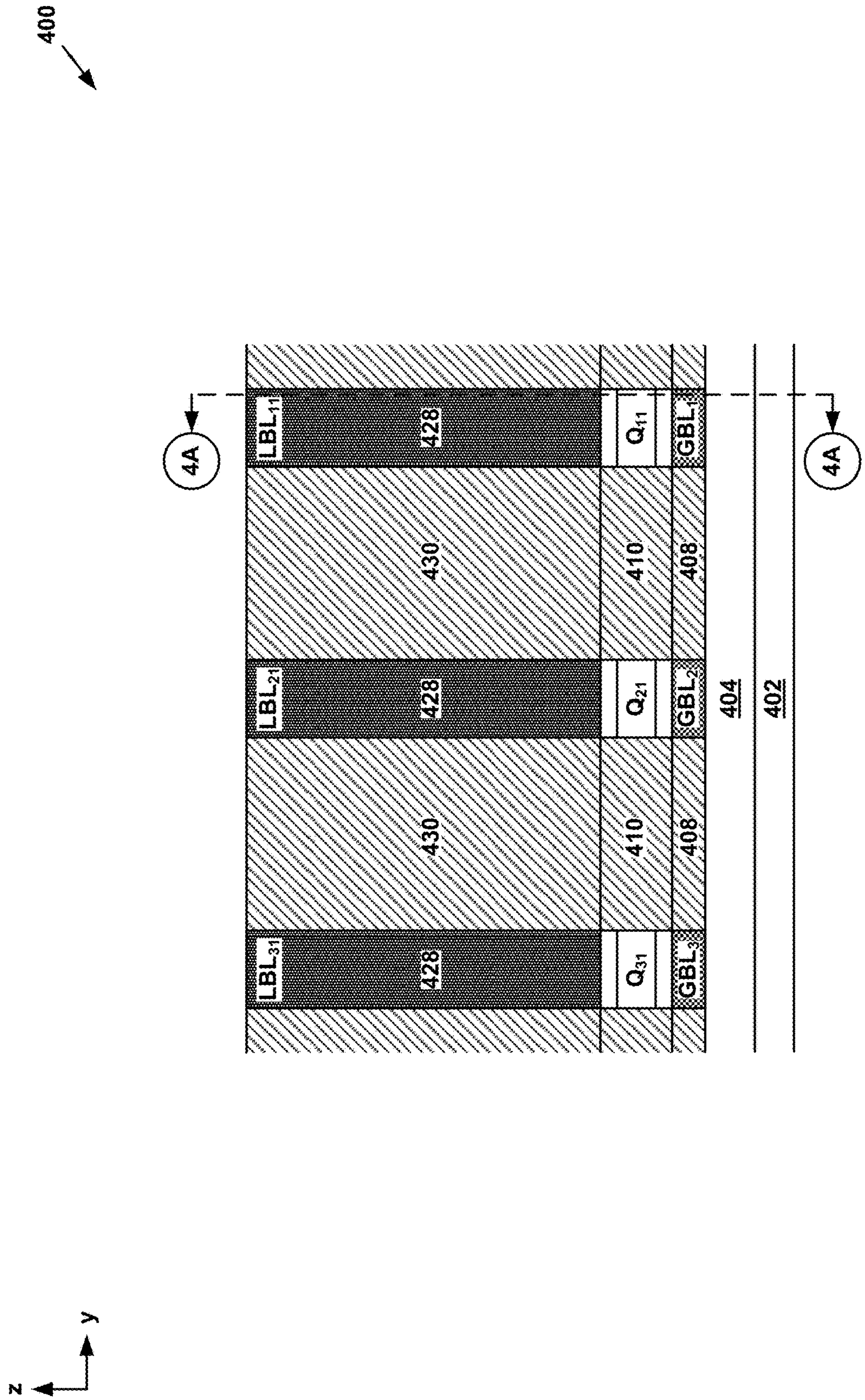
Figure 4C:
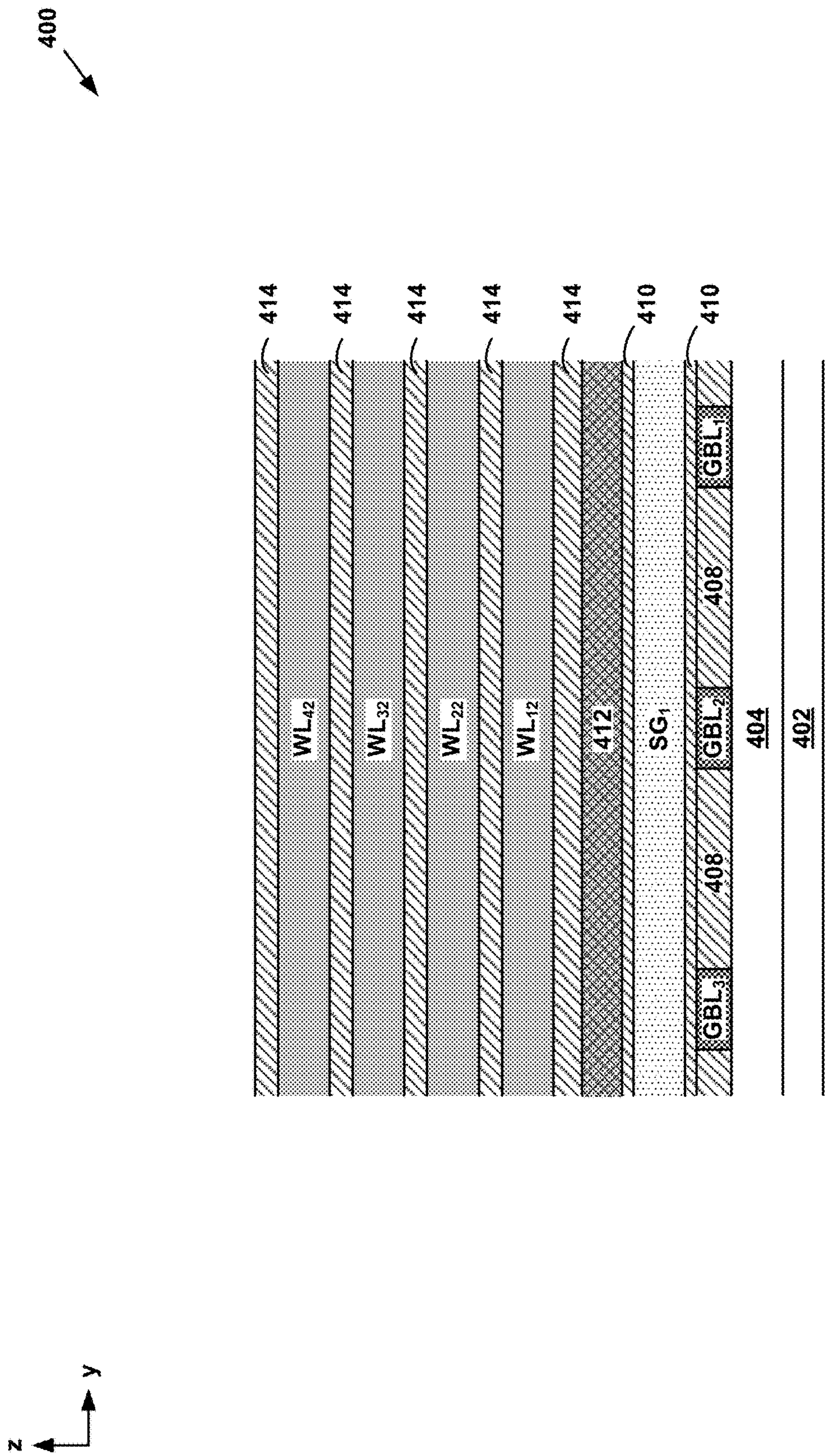
Figure 4D:
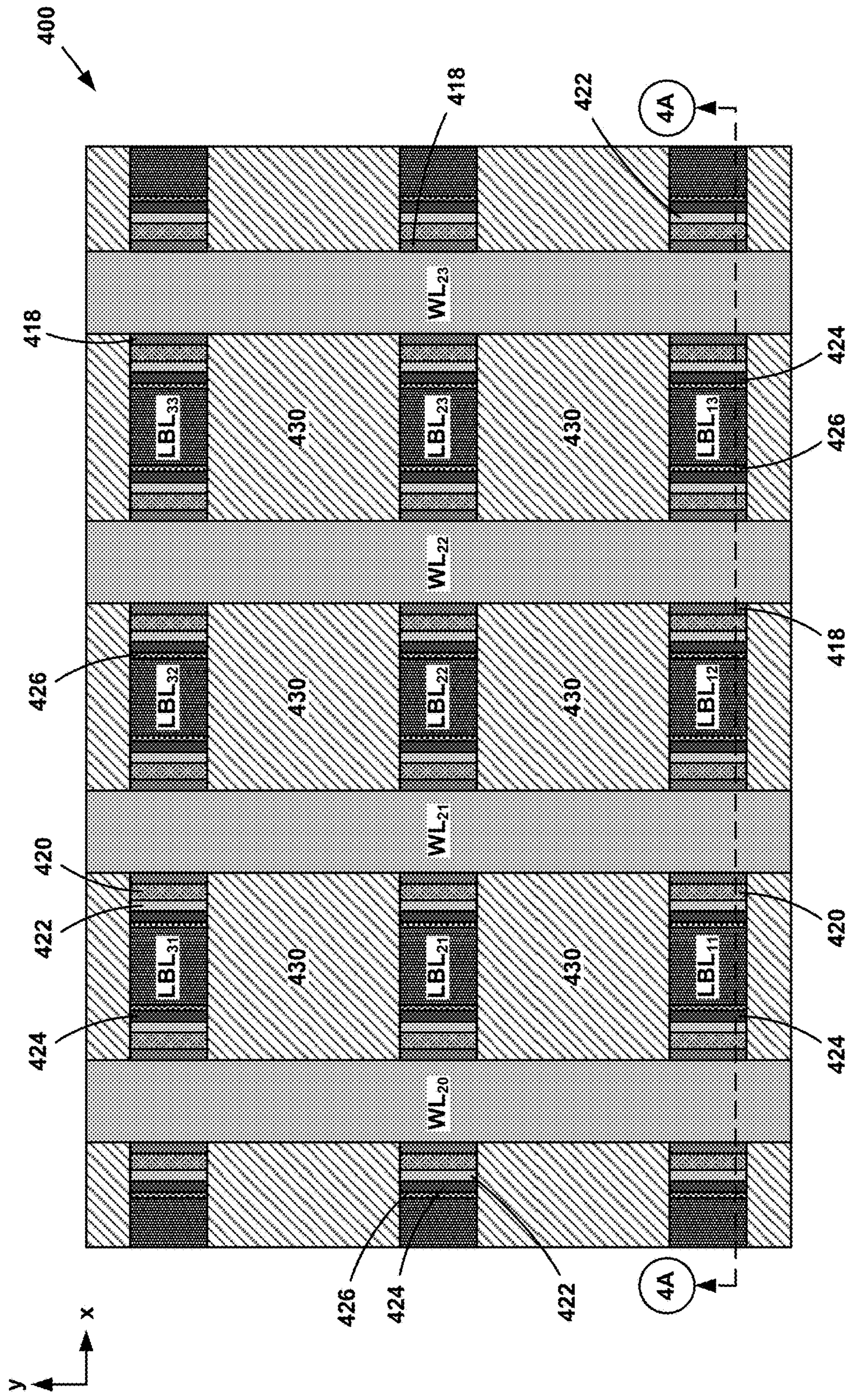
Figure 4E:
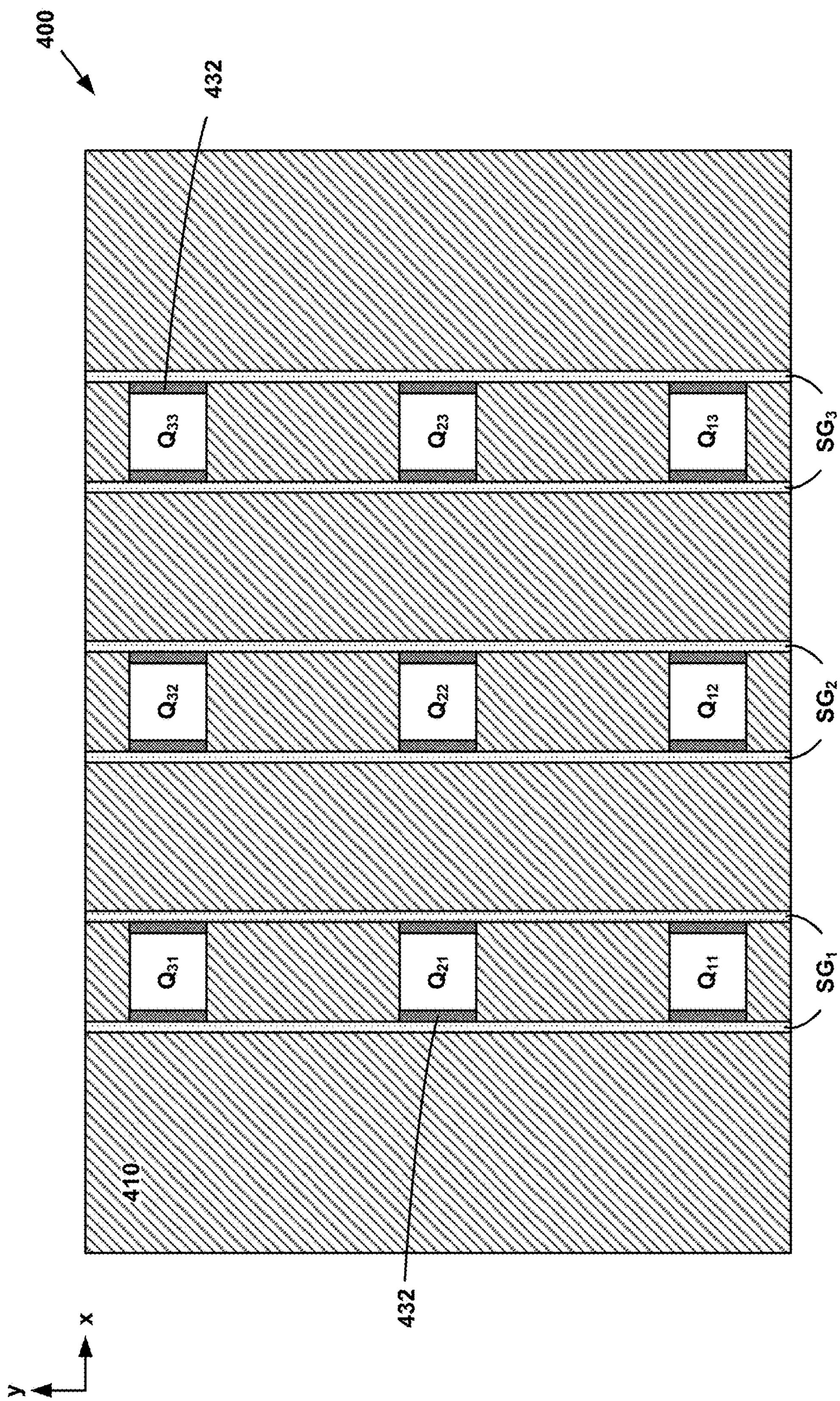

Referring to FIGS. 4A and 4E, vertically-oriented bit line select transistors $Q_{11}$, $Q_{12}$, $Q_{13}$ are used to selectively connect/disconnect vertical bit lines $LBL_{11}$, $LBL_{12}$, $LBL_{13}$ to/from global bit line $GBL_1$ using row select lines $SG_1$, $SG_2$, $SG_3$, respectively. In particular, each of vertically-oriented bit line select transistors $Q_{11}$, $Q_{12}$, $Q_{13}$ has a first terminal (e.g., a drain/source terminal) coupled to a corresponding one of vertical bit lines $LBL_{11}$, $LBL_{12}$, $LBL_{13}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1$, $SG_2$, $SG_3$ are used to turn ON/OFF vertically-oriented bit line select transistors $Q_{11}$, $Q_{12}$, $Q_{13}$, respectively, to connect/disconnect vertical bit lines $LBL_{11}$, $LBL_{12}$, $LBL_{13}$, respectively, to/from global bit line $GBL_1$. A gate dielectric material layer 432 (e.g., silicon dioxide) is disposed between row select lines $SG_1$, $SG_2$, $SG_3$ and vertically-oriented bit line select transistors $Q_{11}$, $Q_{12}$, $Q_{13}$.

Likewise, vertically-oriented bit line select transistors $Q_{11}$, $Q_{21}$, . . . , $Q_{33}$ are used to selectively connect/disconnect vertical bit lines $LBL_{11}$, $LBL_{21}$, $LBL_{31}$ to global bit lines $GBL_1$, $GBL_2$, $GBL_3$, respectively, using row select line $SG_1$. In particular, each of vertically-oriented bit line select transistors $Q_{11}$, $Q_{21}$, $Q_{31}$ has a first terminal (e.g., a drain/source terminal) coupled to a corresponding one of vertical bit lines $LBL_{11}$, $LBL_{21}$, $LBL_{31}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}$, $Q_{21}$, $Q_{31}$ to connect/disconnect vertical bit lines $LBL_{11}$, $LBL_{23}$, $LBL_{31}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit lines $LBL_{13}$, $LBL_{23}$, $LBL_{33}$ to/from global bit lines $GBL_1$, $GBL_2$, $GBL_3$, respectively, using row select line $SG_3$. In particular, each of vertically-oriented bit line select transistors $Q_{13}$, $Q_{23}$, $Q_{33}$ has a first terminal (e.g., a drain/source terminal) coupled to a corresponding one of vertical bit lines $LBL_{13}$, $LBL_{23}$, $LBL_{33}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}$, $Q_{23}$, $Q_{33}$ to connect/disconnect vertical bit lines $LBL_{33}$, $LBL_{23}$, $LBL_{33}$, respectively, to/from global bit lines $GBL_1$, $GBL_2$, $GBL_3$, respectively.

Referring now to FIGS. 5A1-5H3, an example method of forming a monolithic three-dimensional memory array, such as monolithic three-dimensional array 400 of FIGS. 4A-4E, is described.

With reference to FIGS. 5A1-5A3, substrate 402 is shown as having already undergone several processing steps. Substrate 402 may be any suitable substrate such as a silicon, germanium, silicon-germanium, undoped, doped, bulk, silicon-on-insulator ("SOI") or other substrate with or without additional circuitry. For example, substrate 402 may include one or more n-well or p-well regions (not shown). Isolation layer 404 is formed above substrate 402. In some embodiments, isolation layer 404 may be a layer of silicon dioxide, silicon nitride, silicon oxynitride or any other suitable insulating layer.

Following formation of isolation layer 404, a conductive material layer 406 is deposited over isolation layer 404. Conductive material layer 406 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 406 may comprise between about 20 nm and about 250 nm of tungsten. Other conductive material layers and/or thicknesses may be used. In some embodiments, an adhesion layer (not shown), such as titanium nitride or other similar adhesion layer material, may be disposed between isolation layer 404 and conductive material layer 406, and/or between conductive material layer 406 and subsequent vertically-oriented bit line select transistors layers.

Persons of ordinary skill in the art will understand that adhesion layers may be formed by PVD or another method on conductive material layers. For example, adhesion layers may be between about 2 nm and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 406, conductive material layer 406 is patterned and etched. For example, conductive material layer 406 may be patterned and etched using conventional lithography techniques, with a soft or hard mask, and wet or dry etch processing. In at least one embodiment, conductive material layer 406 is patterned and etched to form global bit lines $GBL_1$, $GBL_2$, $GBL_3$. Example widths for global bit lines $GBL_1$, $GBL_2$, $GBL_3$ and/or spacings between global bit lines $GBL_1$, $GBL_2$, $GBL_3$ range between about 48 nm and about 100 nm, although other conductor widths and/or spacings may be used.

After global bit lines $GBL_1$, $GBL_2$, $GBL_3$ have been formed, a first dielectric material layer 408 is formed over substrate 402 to fill the voids between global bit lines $GBL_1$, $GBL_2$, $GBL_3$. For example, approximately 300-700 nm of silicon dioxide may be deposited on the substrate 402 and planarized using chemical mechanical polishing or an etchback process to form a planar surface 500. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, $GBL_3$ may be formed using a damascene process in which first dielectric material layer 408 is formed, patterned and etched to create openings or voids for global bit lines $GBL_1$, $GBL_2$, $GBL_3$. The openings or voids then may be filled with conductive layer 406 (and/or a conductive seed, conductive fill and/or barrier layer if needed). Conductive material layer 406 then may be planarized to form planar surface 500.

Following planarization, the semiconductor material used to form vertically-oriented bit line select transistors $Q_{11}$-$Q_{33}$ is formed over planarized top surface 500 of substrate 402. In some embodiments, each vertically-oriented bit line select transistor is formed from a polycrystalline semiconductor material such as polysilicon, an epitaxial growth silicon, a polycrystalline silicon-germanium alloy, polygermanium or any other suitable material. Alternatively, vertically-oriented bit line select transistors $Q_{11}$-$Q_{33}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor $Q_{11}$-$Q_{33}$ may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ polysilicon layer 502 may be deposited on planarized top surface 500. In some embodiments, n+ polysilicon layer 502 is in an amorphous state as deposited. In other embodiments, n+ polysilicon layer 502 is in a polycrystalline state as deposited. CVD or another suitable process may be employed to deposit n+ polysilicon layer 502.

In an embodiment, n+ polysilicon layer 502 may be formed, for example, from about 10 nm to about 50 nm, of phosphorus or arsenic doped silicon having a doping concentration of about $10^{21}$ $cm^{-3}$. Other layer thicknesses, doping types and/or doping concentrations may be used. N+ polysilicon layer 502 may be doped in situ, for example, by flowing a donor gas during deposition. Other doping methods may be used (e.g., implantation).

After deposition of n+ silicon layer 502, a doped p-type silicon layer 504 may be formed over n+ polysilicon layer 502. P-type silicon may be either deposited and doped by ion implantation or may be doped in situ during deposition to form a p-type silicon layer 504. For example, an intrinsic silicon layer may be deposited on n+ polysilicon layer 502, and a blanket p-type implant may be employed to implant boron a predetermined depth within the intrinsic silicon layer. Example implantable molecular ions include $BF_2$, $BF_3$, B and the like. In some embodiments, an implant dose of about 1-10×$10^{13}$ ions/$cm^2$ may be employed. Other implant species and/or doses may be used. Further, in some embodiments, a diffusion process may be employed. In an embodiment, the resultant p-type silicon layer 504 has a thickness of from about 80 nm to about 400 nm, although other p-type silicon layer sizes may be used.

Following formation of p-type silicon layer 504, a heavily doped n+ polysilicon layer 506 is deposited on p-type silicon layer 504. In some embodiments, n+ polysilicon layer 506 is in an amorphous state as deposited. In other embodiments, n+ polysilicon layer 506 is in a polycrystalline state as deposited. CVD or another suitable process may be employed to deposit n+ polysilicon layer 506.

In an embodiment, n+ polysilicon layer 506 may be formed, for example, from about 10 nm to about 50 nm of phosphorus or arsenic doped silicon having a doping concentration of about $10^{21}$ $cm^{-3}$. Other layer thicknesses, doping types and/or doping concentrations may be used. N+ polysilicon layer 506 may be doped in situ, for example, by flowing a donor gas during deposition. Other doping methods may be used (e.g., implantation). Persons of ordinary skill in the art will understand that silicon layers 502, 504 and 506 alternatively may be doped p+/n/p+, respectively, or may be doped with a single type of dopant to produce junctionless-FETs.

Following formation of n+ polysilicon layer 506, silicon layers 502, 504 and 506 are patterned and etched to form vertical transistor pillars. For example, silicon layers 502, 504 and 506 may be patterned and etched using conventional lithography techniques, with wet or dry etch processing. In an embodiment, silicon layers 502, 504 and 506 are patterned and etched to form vertical transistor pillars disposed above global bit lines $GBL_1$, $GBL_2$, $GBL_3$. The vertical transistor pillars will be used to form vertically-oriented bit line select transistors $Q_{11}$-$Q_{33}$.

Silicon layers 502, 504 and 506 may be patterned and etched in a single pattern/etch procedure or using separate pattern/etch steps. Any suitable masking and etching process may be used to form vertical transistor pillars. For example, silicon layers may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, the vertical transistor pillars may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A gate dielectric material layer 432 is deposited conformally over substrate 402, and forms on sidewalls of the vertical transistor pillars. For example, between about 3 nm to about 10 nm of silicon dioxide may be deposited. Other dielectric materials such as silicon nitride, silicon oxynitride, low K dielectrics, etc., and/or other dielectric material layer thicknesses may be used.

Gate electrode material is deposited over the vertical transistor pillars and gate dielectric material layer 432 to fill the voids between the vertical transistor pillars. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines $SG_1$, $SG_2$, $SG_3$.

A second dielectric material layer 410 is deposited over substrate 402. For example, approximately 500 nm to about 800 nm of silicon dioxide may be deposited and planarized using chemical mechanical polishing or an etch-back process to form planar top surface 508, resulting in the structure shown in FIGS. 5A1-5A3. Other dielectric materials and/or thicknesses may be used.

Planar surface 508 includes exposed top surfaces of vertically-oriented bit line select transistors $Q_{11}$-$Q_{33}$ and gate dielectric material layer 432 separated by second dielectric material layer 410. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Next, a first etch stop layer 412 is formed over substrate 402. First etch stop layer 412 may include any suitable etch stop layer formed by any suitable method (e.g., CVD, PVD, etc.). In an embodiment, first etch stop layer 412 may include between about 5 nm and about 50 nm of silicon nitride. Other etch stop layer materials and/or thicknesses may be used.

Alternating layers of third dielectric material layer 414 and a conductive material layer 510 are formed over substrate 402. In an embodiment, each third dielectric material layer 414 may be between about 20 nm and about 50 nm of $SiO_2$, each conductive material layer 510 may be between about 25 nm and about 40 nm of TiN. Other dielectric materials and/or thicknesses, other conductive materials and/or thicknesses may be used. In an embodiment, four conductive material layers 510 are formed over substrate 402. More or fewer than four conductive material layers 510 may be used.

Next, a second etch stop layer 512 is formed over substrate 402, resulting in the structure shown in FIGS. 5B1-5B2. Second etch stop layer 512 may include any suitable etch stop layer formed by any suitable method (e.g., CVD, PVD, etc.). In an embodiment, second etch stop layer 512 may comprise between about 5 nm and about 50 nm of silicon nitride. Other etch stop layer materials and/or thicknesses may be used.

Figure 5C:
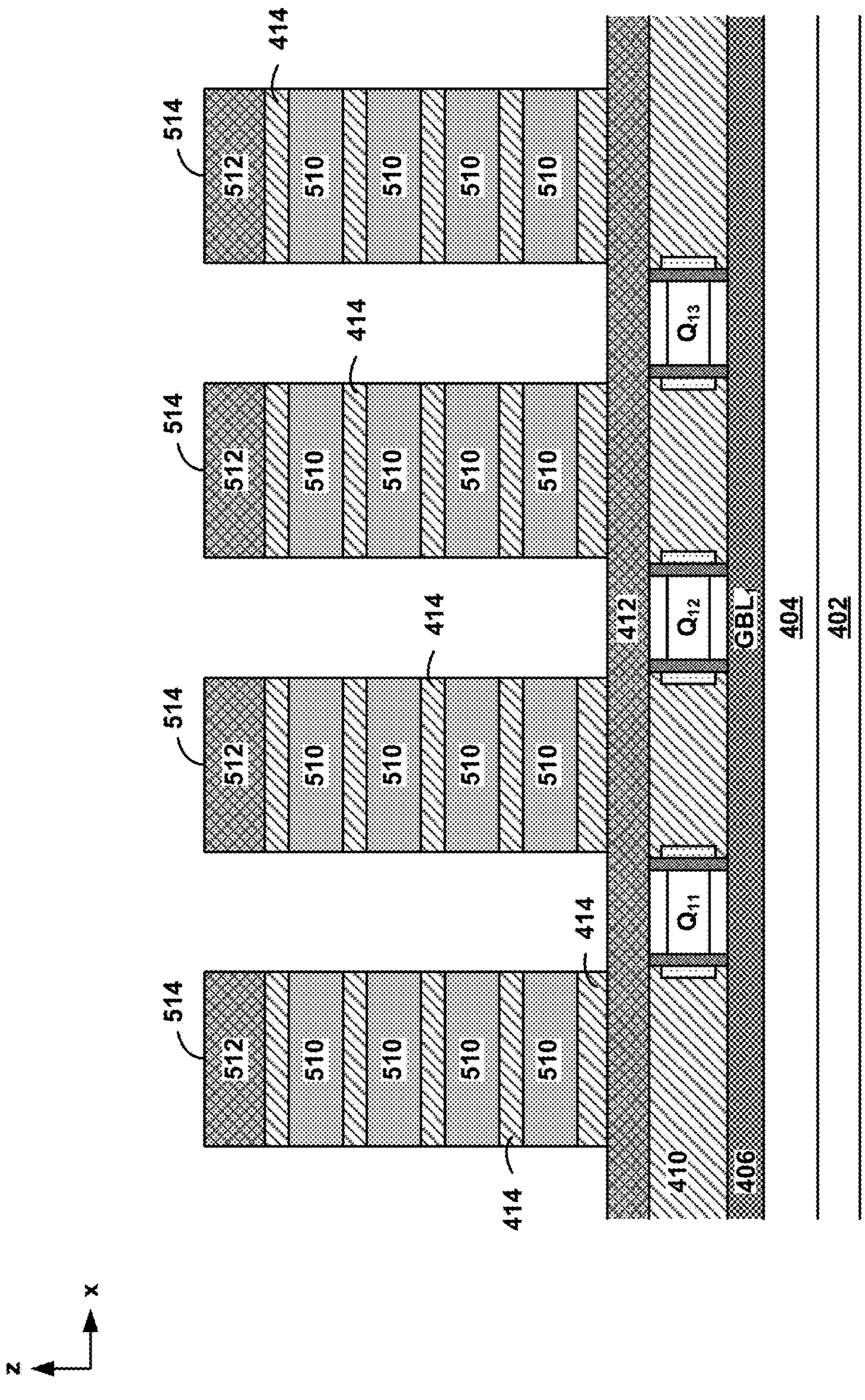

Next, second etch stop layer 512, third dielectric material layers 414, and conductive material layers 510 are patterned and etched to form rows 514 of multi-layer word lines $WL_{10}$, $WL_{11}$, . . . , $WL_{43}$, resulting in the structure shown in FIG. 5C. Each of rows 514 of word lines $WL_{10}$, $WL_{33}$, . . . , $WL_{43}$ may be between about 20 nm and about 100 nm wide, although other widths may be used.

Next, an etch is performed to form voids 516 at ends of conductive material layers 510, resulting in the structure shown in FIGS. 5D1-5D2. Each of voids 516 may have a depth D of between about 10 nm and about 20 nm, although other depths may be used.

A semiconductor material layer 418, a conductive oxide material layer 420, and a conductive material layer 422 are deposited conformally over rows 514, filling voids 516. In an embodiment, semiconductor material layer 418 is between about 3 nm and about 8 nm of amorphous silicon, conductive oxide material layer 420 is between about 6 nm and about 12 nm of $TiO_2$, and conductive material layer 422 between about 5 nm and about 20 nm of TiN. Other materials and/or thicknesses may be used. A barrier material layer (e.g., between about 0.5 nm to about 2 nm of $Al_2O_3$) may be disposed between semiconductor material layer 418 and conductive oxide material layer 420.

An anisotropic etch is used to remove lateral portions of semiconductor material layer 418, conductive oxide material layer 420, and conductive material layer 422, leaving only sidewall portions of semiconductor material layer 418, conductive oxide material layer 420, and conductive material layer 422 in voids 516, resulting in the structure shown in FIG. 5E1-5E2.

A semiconductor material 424 and a barrier material 426 are deposited conformally over rows 514. In an embodiment, semiconductor material 424 is between about 5 nm and about 15 nm of α-silicon-germanium (α-$Si_xGe_{1-x}$, with x between about 0.3 to about 0.7), and barrier material 426 is between about 1 nm and about 5 nm TaN. Other and/or thicknesses may be used.

An anisotropic etch is used to remove lateral portions of semiconductor material 424 and a barrier material 426, leaving only sidewall portions of semiconductor material 424 and a barrier material 426, resulting in the structure shown in FIG. 5F1-5F2.

First etch stop layer 316 is patterned and etched to form cavities 518 and expose top surfaces of bit line select transistors $Q_{11}$-$Q_{31}$, resulting in the structure shown in FIGS. 4G1-4G2.

A conductive material 428 is deposited over substrate 402. In an embodiment, conductive material layer 428 is between about 10 nm and about 50 nm of Cu deposited by any suitable method (e.g., CVD, PVD, etc.). Other conductive materials and/or thicknesses may be used.

Semiconductor material layer 418, conductive oxide material layer 420, conductive material layer 422, semiconductor material 42, barrier material 426 and conductive material 428 are then patterned and etched to form vertical bit lines $LBL_{11}$-$LBL_{33}$, and strips of semiconductor material layer 418, conductive oxide material layer 420, conductive material layer 422, semiconductor material 424 and barrier material 426.

A dielectric material 430, such as silicon dioxide, may then be deposited over substrate 402, filling the voids between vertical bit lines $LBL_{11}$-$LBL_{33}$, and then planarized using chemical mechanical polishing or an etch-back process, resulting in the structure shown in FIGS. 5H1-5H3.

Thus, as described above, one embodiment of the disclosed technology includes a method that includes forming a bit line above a substrate; forming a word line above the substrate, and forming a non-volatile memory cell between the bit line and the word line. The non-volatile memory cell includes a non-volatile memory material coupled in series with an isolation element. The isolation element includes a first electrode, a second electrode, and a semiconductor layer and a barrier layer disposed between the first electrode and the second electrode.

One embodiment of the disclosed technology includes a method including forming a bit line disposed in a first direction above a substrate, forming a word line disposed in a second direction above the substrate, the second direction perpendicular to the first direction, forming a void at an end of the word line, and forming a non-volatile memory cell at an intersection of the bit line and the word line. Forming the non-volatile memory cell includes forming a non-volatile memory material in the void, and forming an isolation element adjacent the non-volatile memory material. The isolation element includes a first electrode, a second electrode, and a semiconductor layer and a barrier layer disposed between the first electrode and the second electrode.

One embodiment of the disclosed technology includes a method that includes forming an isolation element by forming a first electrode above a substrate, forming a semiconductor layer above the first electrode, forming a barrier layer above the semiconductor layer, and forming a second electrode above the barrier layer. The method further includes applying a voltage bias to the first electrode while applying one or more voltage pulses to the second electrode until the isolation element conducts a desired current. The isolation element has an ON-state current density of greater than about 1-5 $MA/cm^2$, an OFF-state leakage current of less than about 10-20 nA@1V, and an ON/OFF current ratio of greater than about 500.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:

forming a bit line above a substrate;

forming a word line above the substrate;

etching the word line to form a void adjacent an end of the word line;

forming a non-volatile memory material in the void; and forming a non-volatile memory cell between the bit line and the word line, the non-volatile memory cell comprising the non-volatile memory material coupled in series with an isolation element, wherein:

the isolation element comprises a first electrode, a second electrode, and a semiconductor layer and a barrier layer disposed between the first electrode and the second electrode.

2. The method of claim 1, wherein the isolation element further comprises a first capping layer disposed between the semiconductor layer and the barrier layer.

3. The method of claim 1, wherein the isolation element further comprises a second capping layer disposed between the semiconductor layer and the second electrode.

4. The method of claim 1, wherein the first electrode comprises one or more of copper, silver, and nickel.

5. The method of claim 1, wherein the second electrode comprises one or more of titanium nitride, a conductive carbon, platinum, ruthenium, palladium, iridium, titanium aluminum nitride, and tungsten.

6. The method of claim 1, wherein the semiconductor layer comprises one or more of silicon, germanium, silicon-germanium, hafnium oxide, silicon oxide, titanium oxide, tungsten oxide and zinc oxide.

7. The method of claim 1, wherein the barrier layer comprises one or more of titanium, tantalum, titanium nitride, tantalum nitride, tungsten nitride, and tantalum carbide.

8. The method of claim 1, wherein the bit line comprises the first electrode or the second electrode.

9. The method of claim 1, wherein the non-volatile memory material comprises a reversible resistance-switching memory element.

10. The method of claim 1, wherein the non-volatile memory material comprises one or more of a phase change material, a ferroelectric material, a metal oxide, and a barrier modulated switching structure.

11. A method comprising:

forming a bit line disposed in a first direction above a substrate;

forming a word line disposed in a second direction above the substrate, the second direction perpendicular to the first direction;

etching the word line to form a void at an end of the word line; and forming a non-volatile memory cell at an intersection of the bit line and the word line by:

forming a non-volatile memory material in the void; and forming an isolation element adjacent the non-volatile memory material, the isolation element comprising a first electrode, a second electrode, and a semiconductor layer and a barrier layer disposed between the first electrode and the second electrode.

12. The method of claim 11, wherein the isolation element further comprises a first capping layer disposed between the semiconductor layer and the barrier layer.

13. The method of claim 11, wherein the isolation element further comprises a second capping layer disposed between the semiconductor layer and the second electrode.

14. The method of claim 11, wherein the first electrode comprises one or more of copper, silver, and nickel.

15. The method of claim 1, wherein the semiconductor layer comprises one or more of silicon, germanium, silicon-germanium, hafnium oxide, silicon oxide, titanium oxide, tungsten oxide and zinc oxide.

16. The method of claim 11, wherein the barrier layer comprises one or more of titanium, tantalum, titanium nitride, tantalum nitride, tungsten nitride, and tantalum carbide.

17. The method of claim 1, wherein the non-volatile memory material comprises a reversible resistance-switching memory element.

18. The method of claim 1, wherein the non-volatile memory material comprises one or more of a phase change material, a ferroelectric material, a metal oxide, and a barrier modulated switching structure.

* * * * *